United States Patent
Krames et al.

(10) Patent No.: US 8,729,559 B2
(45) Date of Patent: May 20, 2014

(54) METHOD OF MAKING BULK INGAN SUBSTRATES AND DEVICES THEREON

(75) Inventors: Mike Krames, Goleta, CA (US); Mark D'Evelyn, Goleta, CA (US); Rajeev Pakalapati, Goleta, CA (US); Alex Alexander, Goleta, CA (US); Derrick Kamber, Goleta, CA (US)

(73) Assignee: Soraa, Inc., Fremont, CA (US)

( * ) Notice: Subject to any disclaimer, the term of this patent is extended or adjusted under 35 U.S.C. 154(b) by 10 days.

(21) Appl. No.: 13/272,981

(22) Filed: Oct. 13, 2011

(65) Prior Publication Data

US 2012/0091465 A1  Apr. 19, 2012

Related U.S. Application Data

(60) Provisional application No. 61/392,565, filed on Oct. 13, 2010.

(51) Int. Cl.
*H01L 29/15* (2006.01)
*H01L 29/06* (2006.01)
*H01L 33/00* (2010.01)
*H01L 21/31* (2006.01)

(52) U.S. Cl.
USPC .................. 257/76; 257/14; 257/98; 438/775

(58) Field of Classification Search
CPC ..................... H01L 21/02458; H01L 21/0254; H01L 33/007
USPC ................................. 257/76, 14, 98; 438/775
See application file for complete search history.

(56) References Cited

U.S. PATENT DOCUMENTS

| | | |
|---|---|---|
| 3,245,760 A | 4/1966 | Sawyer |
| 3,303,053 A | 2/1967 | Strong et al. |
| 3,335,084 A | 8/1967 | Hall |
| 4,030,966 A | 6/1977 | Hornig et al. |
| 4,066,868 A | 1/1978 | Witkin et al. |
| 4,350,560 A | 9/1982 | Helgeland et al. |
| 4,430,051 A | 2/1984 | Von Platen |
| 5,098,673 A | 3/1992 | Engel et al. |
| 5,169,486 A | 12/1992 | Young et al. |
| 5,868,837 A | 2/1999 | DiSalvo et al. |

(Continued)

FOREIGN PATENT DOCUMENTS

| | | |
|---|---|---|
| CN | 101061570 | 10/2007 |
| JP | 2005-289797 A2 | 10/2005 |

(Continued)

OTHER PUBLICATIONS

Anurag Tyagi et al "Partial strain relaxation via misfit dislocation generation at heterointerfaces in (Al,In)GaN epitaxial layers grown on semipolar (1122) GaN free standing substrate", App. Phys. Lett 95. 251905 (2009).*

(Continued)

*Primary Examiner* — Long K. Tran
*Assistant Examiner* — Dzung Tran
(74) *Attorney, Agent, or Firm* — Kilpatrick Townsend & Stockton LLP

(57) ABSTRACT

A relaxed epitaxial $Al_xIn_yGa_{(1-x-y)}N$ layer on a substrate having a semipolar surface orientation includes a plurality of misfit dislocations in portions of the thickness of the epitaxial layer to reduce bi-axial strain to a relaxed state.

19 Claims, 9 Drawing Sheets

Growth of epitaxial layer on patterned substrate or epitaxial layer

(56) References Cited

U.S. PATENT DOCUMENTS

| | | |
|---|---|---|
| 6,090,202 A | 7/2000 | Klipov |
| 6,129,900 A | 10/2000 | Satoh et al. |
| 6,152,977 A | 11/2000 | D'Evelyn |
| 6,273,948 B1 | 8/2001 | Porowski et al. |
| 6,350,191 B1 | 2/2002 | D'Evelyn et al. |
| 6,372,002 B1 | 4/2002 | D'Evelyn et al. |
| 6,398,867 B1 | 6/2002 | D'Evelyn et al. |
| 6,406,540 B1 | 6/2002 | Harris et al. |
| 6,406,776 B1 | 6/2002 | D'Evelyn |
| 6,455,877 B1 | 9/2002 | Ogawa et al. |
| 6,475,254 B1 | 11/2002 | Saak et al. |
| 6,528,427 B2 | 3/2003 | Chebi et al. |
| 6,533,874 B1 | 3/2003 | Vaudo et al. |
| 6,541,115 B2 | 4/2003 | Pender et al. |
| 6,596,040 B2 | 7/2003 | Saak et al. |
| 6,596,079 B1 | 7/2003 | Vaudo et al. |
| 6,639,925 B2 | 10/2003 | Niwa et al. |
| 6,656,615 B2 | 12/2003 | Dwilinski et al. |
| 6,686,608 B1 | 2/2004 | Takahira |
| 6,764,297 B2 | 7/2004 | Godwin et al. |
| 6,765,240 B2 | 7/2004 | Tischler et al. |
| 6,784,463 B2 | 8/2004 | Camras et al. |
| 6,787,814 B2 | 9/2004 | Udagawa |
| 6,806,508 B2 | 10/2004 | D'Evelyn et al. |
| 6,858,882 B2 | 2/2005 | Tsuda et al. |
| 6,861,130 B2 | 3/2005 | D'Evelyn et al. |
| 6,887,144 B2 | 5/2005 | D'Evelyn et al. |
| 6,936,488 B2 | 8/2005 | D'Evelyn et al. |
| 6,955,719 B2 | 10/2005 | Dmitriev et al. |
| 7,001,577 B2 | 2/2006 | Zimmerman et al. |
| 7,009,199 B2 | 3/2006 | Hall et al. |
| 7,009,215 B2 | 3/2006 | D'Evelyn et al. |
| 7,012,279 B2 | 3/2006 | Wierer, Jr. et al. |
| 7,026,756 B2 | 4/2006 | Shimizu et al. |
| 7,033,858 B2 | 4/2006 | Chai et al. |
| 7,053,413 B2 | 5/2006 | D'Evelyn et al. |
| 7,063,741 B2 | 6/2006 | D'Evelyn et al. |
| 7,067,407 B2 | 6/2006 | Kostamo et al. |
| 7,078,731 B2 | 7/2006 | D'Evelyn et al. |
| 7,098,487 B2 | 8/2006 | D'Evelyn et al. |
| 7,101,433 B2 | 9/2006 | D'Evelyn et al. |
| 7,102,158 B2 | 9/2006 | Tysoe et al. |
| 7,105,865 B2 | 9/2006 | Nakahata et al. |
| 7,112,829 B2 | 9/2006 | Picard et al. |
| 7,119,372 B2 | 10/2006 | Stokes et al. |
| 7,122,827 B2 | 10/2006 | Alizadeh et al. |
| 7,125,453 B2 | 10/2006 | D'Evelyn et al. |
| 7,160,388 B2 | 1/2007 | Dwilinski et al. |
| 7,160,531 B1 | 1/2007 | Jacques et al. |
| 7,170,095 B2 | 1/2007 | Vaudo et al. |
| 7,175,704 B2 | 2/2007 | D'Evelyn et al. |
| 7,198,671 B2 | 4/2007 | Ueda |
| 7,208,393 B2 | 4/2007 | Haskell et al. |
| 7,220,658 B2 | 5/2007 | Haskell et al. |
| 7,252,712 B2 | 8/2007 | Dwilinski et al. |
| 7,279,040 B1 | 10/2007 | Wang |
| 7,285,801 B2 | 10/2007 | Eliashevich et al. |
| 7,291,544 B2 | 11/2007 | D'Evelyn et al. |
| 7,316,746 B2 | 1/2008 | D'Evelyn et al. |
| 7,335,262 B2 | 2/2008 | Dwilinski et al. |
| 7,338,828 B2 | 3/2008 | Imer et al. |
| 7,364,619 B2 | 4/2008 | Dwilinski et al. |
| 7,368,015 B2 | 5/2008 | D'Evelyn et al. |
| 7,381,391 B2 | 6/2008 | Spencer et al. |
| 7,420,261 B2 | 9/2008 | Dwilinski et al. |
| 7,569,206 B2 | 8/2009 | Spencer et al. |
| 7,572,425 B2 | 8/2009 | McNulty et al. |
| 7,625,446 B2 | 12/2009 | D'Evelyn et al. |
| 7,642,122 B2 | 1/2010 | Tysoe et al. |
| 7,704,324 B2 | 4/2010 | D'Evelyn et al. |
| 7,705,276 B2 | 4/2010 | Giddings et al. |
| 7,759,710 B1 | 7/2010 | Chiu et al. |
| 7,871,839 B2 | 1/2011 | Lee et al. |
| 7,976,630 B2 | 7/2011 | Poblenz et al. |
| 8,021,481 B2 | 9/2011 | D'Evelyn |
| 8,048,225 B2 | 11/2011 | Poblenz et al. |
| 8,097,081 B2 | 1/2012 | D'Evelyn |
| 8,148,801 B2 | 4/2012 | D'Evelyn |
| 8,188,504 B2 | 5/2012 | Lee |
| 8,198,643 B2 | 6/2012 | Lee et al. |
| 8,207,548 B2 | 6/2012 | Nagai |
| 8,278,656 B2 | 10/2012 | Mattmann et al. |
| 8,284,810 B1 | 10/2012 | Sharma et al. |
| 8,299,473 B1 | 10/2012 | D'Evelyn et al. |
| 8,303,710 B2 | 11/2012 | D'Evelyn |
| 8,306,081 B1 | 11/2012 | Schmidt et al. |
| 8,323,405 B2 | 12/2012 | D'Evelyn |
| 8,329,511 B2 | 12/2012 | D'Evelyn |
| 8,354,679 B1 | 1/2013 | D'Evelyn et al. |
| 8,430,958 B2 | 4/2013 | D'Evelyn |
| 8,435,347 B2 | 5/2013 | D'Evelyn et al. |
| 8,444,765 B2 | 5/2013 | D'Evelyn |
| 8,461,071 B2 | 6/2013 | D'Evelyn |
| 8,465,588 B2 | 6/2013 | Poblenz et al. |
| 8,482,104 B2 | 7/2013 | D'Evelyn et al. |
| 8,492,185 B1 | 7/2013 | D'Evelyn et al. |
| 2001/0009134 A1 | 7/2001 | Kim et al. |
| 2001/0011935 A1 | 8/2001 | Lee et al. |
| 2001/0048114 A1 | 12/2001 | Morita et al. |
| 2002/0070416 A1 | 6/2002 | Morse et al. |
| 2002/0105986 A1 | 8/2002 | Yamasaki |
| 2002/0182768 A1 | 12/2002 | Morse et al. |
| 2002/0189532 A1 | 12/2002 | Motoki et al. |
| 2003/0027014 A1 | 2/2003 | Johnson et al. |
| 2003/0140845 A1 | 7/2003 | D'Evelyn et al. |
| 2003/0145784 A1 | 8/2003 | Thompson et al. |
| 2003/0164507 A1 | 9/2003 | Edmond et al. |
| 2003/0183155 A1 | 10/2003 | D'Evelyn et al. |
| 2003/0209191 A1 | 11/2003 | Purdy |
| 2003/0232512 A1 | 12/2003 | Dickinson et al. |
| 2004/0000266 A1 | 1/2004 | D'Evelyn et al. |
| 2004/0023427 A1 | 2/2004 | Chua et al. |
| 2004/0104391 A1 | 6/2004 | Maeda et al. |
| 2004/0124435 A1 | 7/2004 | D'Evelyn et al. |
| 2004/0161222 A1 | 8/2004 | Niida et al. |
| 2004/0222357 A1 | 11/2004 | King et al. |
| 2005/0087753 A1 | 4/2005 | D'Evelyn et al. |
| 2005/0098095 A1 | 5/2005 | D'Evelyn et al. |
| 2005/0109240 A1 | 5/2005 | Maeta et al. |
| 2005/0121679 A1 | 6/2005 | Nagahama et al. |
| 2005/0128469 A1 | 6/2005 | Hall et al. |
| 2005/0152820 A1 | 7/2005 | D'Evelyn et al. |
| 2005/0167680 A1 | 8/2005 | Shei et al. |
| 2005/0191773 A1 | 9/2005 | Suzuki et al. |
| 2005/0205215 A1 | 9/2005 | Giddings et al. |
| 2005/0263791 A1 | 12/2005 | Yanagihara et al. |
| 2006/0030738 A1 | 2/2006 | Vanmaele et al. |
| 2006/0032428 A1 | 2/2006 | Dwilinski et al. |
| 2006/0037529 A1 | 2/2006 | D'Evelyn et al. |
| 2006/0037530 A1 | 2/2006 | Dwilinski et al. |
| 2006/0038193 A1 | 2/2006 | Wu et al. |
| 2006/0048699 A1 | 3/2006 | D'Evelyn et al. |
| 2006/0096521 A1 | 5/2006 | D'Evelyn et al. |
| 2006/0118799 A1 | 6/2006 | D'Evelyn et al. |
| 2006/0124051 A1 | 6/2006 | Yoshioka et al. |
| 2006/0163589 A1 | 7/2006 | Fan et al. |
| 2006/0169993 A1 | 8/2006 | Fan et al. |
| 2006/0177362 A1 | 8/2006 | D'Evelyn et al. |
| 2006/0207497 A1 | 9/2006 | D'Evelyn et al. |
| 2006/0213429 A1 | 9/2006 | Motoki et al. |
| 2006/0214287 A1 | 9/2006 | Ogihara et al. |
| 2006/0228870 A1 | 10/2006 | Oshima |
| 2006/0246687 A1 | 11/2006 | Kaiser et al. |
| 2006/0255343 A1 | 11/2006 | Ogihara et al. |
| 2006/0288927 A1 | 12/2006 | Chodelka et al. |
| 2006/0289386 A1 | 12/2006 | Tysoe et al. |
| 2007/0015345 A1 | 1/2007 | Baker et al. |
| 2007/0057337 A1 | 3/2007 | Kano et al. |
| 2007/0077674 A1 | 4/2007 | Okuyama et al. |
| 2007/0096239 A1 | 5/2007 | Cao et al. |
| 2007/0105351 A1 | 5/2007 | Motoki et al. |
| 2007/0114569 A1 | 5/2007 | Wu et al. |
| 2007/0121690 A1 | 5/2007 | Fujii et al. |
| 2007/0131967 A1 | 6/2007 | Kawaguchi et al. |

(56) References Cited

U.S. PATENT DOCUMENTS

| | | |
|---|---|---|
| 2007/0141819 A1 | 6/2007 | Park et al. |
| 2007/0142204 A1 | 6/2007 | Park et al. |
| 2007/0151509 A1 | 7/2007 | Park et al. |
| 2007/0158785 A1 | 7/2007 | D'Evelyn et al. |
| 2007/0164292 A1 | 7/2007 | Okuyama |
| 2007/0166853 A1 | 7/2007 | Guenther et al. |
| 2007/0178039 A1 | 8/2007 | D'Evelyn et al. |
| 2007/0181056 A1 | 8/2007 | D'Evelyn et al. |
| 2007/0190758 A1 | 8/2007 | Kaeding et al. |
| 2007/0197004 A1 | 8/2007 | Dadgar et al. |
| 2007/0210074 A1 | 9/2007 | Maurer et al. |
| 2007/0215033 A1 | 9/2007 | Imaeda et al. |
| 2007/0218703 A1* | 9/2007 | Kaeding et al. ............... 438/775 |
| 2007/0228404 A1 | 10/2007 | Tran et al. |
| 2007/0234946 A1 | 10/2007 | Hashimoto et al. |
| 2007/0252164 A1* | 11/2007 | Zhong et al. .................... 257/98 |
| 2007/0274359 A1 | 11/2007 | Takeuchi et al. |
| 2007/0290224 A1 | 12/2007 | Ogawa |
| 2008/0006831 A1 | 1/2008 | Ng |
| 2008/0008855 A1 | 1/2008 | D'Evelyn et al. |
| 2008/0023691 A1 | 1/2008 | Jang et al. |
| 2008/0025360 A1 | 1/2008 | Eichler et al. |
| 2008/0073660 A1 | 3/2008 | Ohno et al. |
| 2008/0083741 A1 | 4/2008 | Giddings et al. |
| 2008/0083929 A1 | 4/2008 | Fan et al. |
| 2008/0083970 A1* | 4/2008 | Kamber et al. ............... 257/615 |
| 2008/0087919 A1 | 4/2008 | Tysoe et al. |
| 2008/0106212 A1 | 5/2008 | Yen et al. |
| 2008/0121906 A1 | 5/2008 | Yakushiji |
| 2008/0128752 A1 | 6/2008 | Wu |
| 2008/0156254 A1 | 7/2008 | Dwilinski et al. |
| 2008/0193363 A1 | 8/2008 | Tsuji |
| 2008/0198881 A1 | 8/2008 | Farrell et al. |
| 2008/0211416 A1 | 9/2008 | Negley et al. |
| 2008/0230765 A1 | 9/2008 | Yoon et al. |
| 2008/0272462 A1 | 11/2008 | Shimamoto |
| 2008/0282978 A1 | 11/2008 | Butcher et al. |
| 2008/0285609 A1 | 11/2008 | Ohta et al. |
| 2008/0298409 A1 | 12/2008 | Yamashita et al. |
| 2009/0078955 A1 | 3/2009 | Fan et al. |
| 2009/0092536 A1 | 4/2009 | Kawabata et al. |
| 2009/0146170 A1 | 6/2009 | Zhong et al. |
| 2009/0218593 A1 | 9/2009 | Kamikawa et al. |
| 2009/0250686 A1 | 10/2009 | Sato et al. |
| 2009/0301387 A1 | 12/2009 | D'Evelyn |
| 2009/0301388 A1 | 12/2009 | D'Evelyn |
| 2009/0309105 A1 | 12/2009 | Letts et al. |
| 2009/0309110 A1 | 12/2009 | Raring et al. |
| 2009/0320744 A1 | 12/2009 | D'Evelyn et al. |
| 2009/0320745 A1 | 12/2009 | D'Evelyn et al. |
| 2010/0001300 A1 | 1/2010 | Raring et al. |
| 2010/0003492 A1 | 1/2010 | D'Evelyn |
| 2010/0003942 A1* | 1/2010 | Ikeda et al. .................... 455/269 |
| 2010/0025656 A1 | 2/2010 | Raring et al. |
| 2010/0031872 A1 | 2/2010 | D'Evelyn |
| 2010/0031873 A1 | 2/2010 | D'Evelyn |
| 2010/0031874 A1 | 2/2010 | D'Evelyn |
| 2010/0031875 A1 | 2/2010 | D'Evelyn |
| 2010/0031876 A1 | 2/2010 | D'Evelyn |
| 2010/0032691 A1 | 2/2010 | Kim |
| 2010/0075175 A1* | 3/2010 | Poblenz et al. ............... 428/697 |
| 2010/0104495 A1 | 4/2010 | Kawabata et al. |
| 2010/0108985 A1* | 5/2010 | Chung et al. .................... 257/13 |
| 2010/0109030 A1 | 5/2010 | Krames et al. |
| 2010/0109126 A1 | 5/2010 | Arena |
| 2010/0117101 A1 | 5/2010 | Kim et al. |
| 2010/0117118 A1 | 5/2010 | Dabiran et al. |
| 2010/0147210 A1 | 6/2010 | D'Evelyn |
| 2010/0151194 A1 | 6/2010 | D'Evelyn |
| 2010/0189981 A1* | 7/2010 | Poblenz et al. ............... 428/220 |
| 2010/0219505 A1 | 9/2010 | D'Evelyn |
| 2010/0295088 A1 | 11/2010 | D'Evelyn et al. |
| 2011/0017298 A1 | 1/2011 | Lee |
| 2011/0062415 A1* | 3/2011 | Ohta et al. .................... 257/14 |
| 2011/0064103 A1* | 3/2011 | Ohta et al. .................... 372/45.01 |
| 2011/0100291 A1 | 5/2011 | D'Evelyn |
| 2011/0108081 A1 | 5/2011 | Werthen et al. |
| 2011/0121331 A1 | 5/2011 | Simonian et al. |
| 2011/0175200 A1 | 7/2011 | Yoshida |
| 2011/0183498 A1 | 7/2011 | D'Evelyn |
| 2011/0220912 A1 | 9/2011 | D'Evelyn |
| 2011/0256693 A1 | 10/2011 | D'Evelyn et al. |
| 2011/0262773 A1 | 10/2011 | Poblenz et al. |
| 2012/0000415 A1 | 1/2012 | D'Evelyn et al. |
| 2012/0007102 A1 | 1/2012 | Feezell et al. |
| 2012/0073494 A1 | 3/2012 | D'Evelyn |
| 2012/0118223 A1 | 5/2012 | D'Evelyn |
| 2012/0119218 A1 | 5/2012 | Su |
| 2012/0137966 A1 | 6/2012 | D'Evelyn et al. |
| 2012/0178215 A1 | 7/2012 | D'Evelyn |
| 2012/0187412 A1 | 7/2012 | D'Evelyn et al. |
| 2012/0199952 A1 | 8/2012 | D'Evelyn et al. |
| 2013/0119401 A1 | 5/2013 | D'Evelyn et al. |
| 2013/0251615 A1 | 9/2013 | D'Evelyn et al. |
| 2013/0323490 A1 | 12/2013 | D'Evelyn et al. |

FOREIGN PATENT DOCUMENTS

| | | |
|---|---|---|
| JP | 2007-039321 A | 2/2007 |
| WO | WO 2005121415 A1 | 12/2005 |
| WO | 2006/057463 | 6/2006 |
| WO | WO2007-004495 | 1/2007 |
| WO | WO 2010/068916 | 6/2010 |
| WO | WO2012-016033 | 2/2012 |

OTHER PUBLICATIONS

Altoukhov et al., 'High reflectivity airgap distributed Bragg reflectors realized by wet etching of AlInN sacrificial layers', Applied Physics Letters, vol. 95, 2009, pp. 191102-1-191102-3.

Dorsaz et al., 'Selective oxidation of AlInN Layers for current confinement in III-nitride devices', Applied Physics Letters, vol. 87, 2005, pp. 072102-1 to 072102-3.

Ehrentraut et al., 'The ammonothermal crystal growth of gallium nitride—A technique on the up rise', Proceedings IEEE, 2010, 98(7), pp. 1316-1323.

Fang., 'Deep centers in semi-insulating Fe-doped native GaN substrates grown by hydride vapour phase epitaxy', Physica Status Solidi, vol. 5, No. 6, 2008, pp. 1508-1511.

Fujito et al., 'Development of bulk GaN crystals and nonpolar/semipolar substrates by HVPE', MRS Bulletin, 2009, 34, 5, pp. 313-317.

Gladkov et al., 'Effect of Fe doping on optical properties of freestanding semi-insulating HVPE GaN:Fe', Journal of Crystal Growth, vol. 312, 2010, pp. 1205-1209.

Grzegory, 'High pressure growth of bulk GaN from Solutions in gallium', Journal of Physics Condensed Matter, vol. 13, 2001, pp. 6875-6892.

Moutanabbir et al., 'Bulk GaN Ion Cleaving', Journal of Electronic Materials, vol. 39, No. 5, 2010, pp. 482-488.

Oshima et al., 'Thermal and optical properties of bulk GaN crystals fabricated through hydride vapor phase epitaxy with void-assisted separation', Journal of Applied Physics, vol. 98, 2005, pp. 103509-1-103509-4.

International Search Report of PCT Application No. PCT/US2009/67745, dated Feb. 5, 2010, 1 page total.

Porowski, 'High Resistivity GaN Single Crystalline Substrates', Acta Physica Polonica A, vol. 92, No. 5, 1997, pp. 958-962.

Porowski, 'Near Defect Free GaN Substrates', Journal of Nitride Semiconductor, 1999, pp. 1-11.

Sharma et al., 'Vertically oriented GaN-based air-gap distributed Bragg reflector structure fabricated using band-gap-selective photoelectrochemical etching', Applied Physics Letters, vol. 87, 2005, pp. 051107-1 to 051107-3.

USPTO Office Action for U.S. Appl. No. 12/133,365 dated May 13, 2013.

USPTO Office Action for U.S. Appl. No. 12/497,969 dated May 16, 2013.

USPTO Office Action for U.S. Appl. No. 12/636,683 dated Jun. 12, 2013.

(56) References Cited

OTHER PUBLICATIONS

USPTO Office Action for U.S. Appl. No. 12/891,668 dated Jan. 10, 2013.
USPTO Notice of Allowance for U.S. Appl. No. 12/891,668 dated Mar. 20, 2013.
USPTO Notice of Allowance for U.S. Appl. No. 13/175,739 dated Mar. 21, 2013.
USPTO Office Action for U.S. Appl. No. 13/346,507 dated Dec. 21, 2012.
USPTO Notice of Allowance for U.S. Appl. No. 13/346,507 dated Apr. 22, 2013.
USPTO Notice of Allowance for U.S. Appl. No. 13/548,931 dated Jun. 3, 2013.
Byrappa et al., "Handbook of Hydrothermal Technology: A Technology for Crystal Growth and Materials Processing," Noyes Publications, Park Ridge, New Jersey, 2001, pp. 94-96 and 152.
Callahan et al., "Synthesis and Growth of Gallium Nitride by the Chemical Vapor Reaction Process (CVRP)," 1999, MRS Internet Journal Nitride Semiconductor Research, vol. 4, Issue No. 10, pp. 1-6.
Chiang et al. "Luminescent Properties of Cerium-Activated Garnet Series Phosphor: Structure and Temperature Effects," Journal of the Electrochemical Society 155:B517-B520 (2008).
Chiu et al. "Synthesis and Luminescence Properties of Intensely Red-Emitting M5Eu $(WO_4)_{4-x}$ $(MoO_4)_x$ (M=Li, Na, K) Phosphors," Journal of the Electrochemical Society 15:J71-J78 (2008).
Ci et al. "$Ca_{1-x}Mo_{1-y}Nb_yO_4:Eu_x^{3+}$: A novel red phosphor for white light emitting diodes," Journal of Physics 152:670-674 (2008).
D'Evelyn et al., "Bulk GaN Crystal Growth by the High-Pressure Ammonothermal Method," Journal of Crystal Growth, 2007, vol. 300, pp. 11-16.
Dwiliński et al, Ammono Method of BN, AlN, and GaN Synthesis and Crystal Growth,: Journal of Nitride Semiconductor Research, 1998, 3,25, MRS, Internet: http://nsr.mij.mrs.org.
Dwilinski et al., "Excellent Crystallinity of Truly Bulk Ammonothermal GaN," Journal of Crystal Growth, 2008, vol. 310, pp. 3911-3916.
Ehrentraut et al., "Prospects for the Ammonothermal Growth of Large GaN Crystal," Journal of Crystal Growth, 2007, vol. 305, pp. 304-310.
Farrell et al., "Continuous-wave Operation of AlGaN-cladding-free Nonpolar m-Plane InGaN/GaN Laser Diodes," 2007, Japanese Journal of Applied Physics, vol. 46, No. 32, pp. L761-L763.
Feezell et al., "AlGaN-Cladding-Free Nonpolar InGaN/GaN Laser Diodes," Japanese Journal of Applied Physics, vol. 46, No. 13, pp. L284-L286 (Mar. 2007).
Frayssinet et al., "Evidence of Free Carrier Concentration Gradient Along the c-axis for Undoped GaN Single Crystals," Journal of Crystal Growth, 2001, vol. 230, pp. 442-447.
Fukuda et al. "Prospects for the ammonothermal growth of large GaN crystal," Journal of Crystal Growth 305: 304-310 (Jul. 2007).
Happek "Development of Efficient UV-LED Phosphor Coatings for Energy Saving Solid State Lighting" University of Georgia (Jan. 2007).
Hashimoto et al. "Ammonothermal growth of bulk GaN," Journal of Crystal Growth 310:3907-3910 (Aug. 2008).
Hashimoto et al. "A GaN bulk crystal wit improved structural quality grown by the ammonothermal method," Nature Materials 6:568-671 (Jul. 2007).
Höppe et al. "Luminescence in $Eu^{2+}$-doped $Ba_2Si_5N_8$: fluorescence, thernoliminescence, and upconversion"; Journal of Physics and Chemistry of Solids 61:2001-2006 (2000).
Iso et al., "High Brightness Blue InGaN/GaN Light Emitting Diode on Nonpolar m-plane Bulk GaN Substrate," 2007, Japanese Journal of Applied Physics, vol. 46, No. 40, pp. L960-L962.
Kim et al, "Improved Electroluminescence on Nonpolar m-plane InGaN/GaN Qantum Well LEDs", 2007, Physica Status Solidi (RRL), vol. 1, No. 3, pp. 125-127.
Kojima et al., "Stimulated Emission at 474 nm from an InGaN Laser Diode Structure Grown on a (1122) GaN Substrate ," 2007, Applied Physics Letter, vol. 91, No. 25, pp. 251107-251107-3.
Kolis et al., "Crystal Growth of Gallium Nitride in Supercritical Ammonia," Journal of Crystal Growth, 2001, vol. 222, pp. 431-434.
Kolis et al., "Materials Chemistry and Bulk Crystal Growth of Group III Nitrides in Supercritical Ammonia" Mat. Res. Soc. Symp. Proc., 1998, vol. 495, pp. 367-372.
Kubota et al., "Temperature Dependence of Polarized Photoluminescence from Nonpolar m-plane InGaN Multiple Quantum Wells for Blue Laser Diodes" 2008, Applied Physics Letter, vol. 92, pp. 011920-011920-3.
Li et al. "The effect of replacement of Sr by Ca on the structural and luminescence properties of the red-emitting $Sr_2Si_5N_8:Eu_2+$ LED conversion phosphor," Journal of Solid State Chemistry 181:515-524 (2008).
Mirwald et al., "Low-Friction Cell for Piston-Cylinder High Pressure Apparatus," Journal of Geophysical Research, 1975, vol. 80, No. 11, pp. 1519-1525.
Motoki et al. "Growth and Characterization of Freestanding GaN Substrates," Journal of Crystal Growth, 2002, vol. 237-239, pp. 912-921.
Mueller-Mach et al. "Highly efficient all-nitride phosphor-converted white light emitting diode," Physica Status Solidi (a) 202:1727-1732 (Jul. 2005).
Murota et al., "Solid State Light Source Fabricated with YAG:Ce Single Crystal," 2002, Japanese Journal of Applied Physics, vol. 46, No. 41, Part 2, No. 8A, pp. L887-L888.
Okamoto et al., "Continuous-Wave Operation of m-Plane InGaN Multiple Quantum Well Laser Diodes," 2007, Japanese Journal of Applied Physics, vol. 46, No. 9, pp. L187-L189.
Okamoto et al., "Pure Blue Laser Diodes Based on Nonpolar m-Plane Gallium Nitride with InGaN Waveguiding Layers," 2007, Japanese Journal of Applied Physics, vol. 46, No. 35, pp. L820-L822.
Oshima et al., "Thermal and Optical Properties of Bulk GaN Crystals Fabricated Through Hydride Vapor Phase Epitaxy with Void-Assisted Separation," 2005, Journal of Applied Physics, vol. 98, pp. 103509-1-103509-3.
Peters, "Ammonothermal Synthesis of Aluminium Nitride," Journal of Crystal Growth, 1999, vol. 4, pp. 411-418.
Sarva, et al. "Dynamic compressive strength of silicon carbide under uniaxial compression," Mat. Sci. & Eng. A 317,140 (2001).
Sato et al., "High Power and High Efficiency Green Light Emitting Diode on free-Standing Semipolar (1122) Bulk GaN Substrate," 2007.Physica Status Solidi (RRL), vol. 1, pp. 162-164.
Sato et al., "Optical Properties of Yellow Light-Emitting-Diodes Grown on Semipolar (1122) Bulk GaN Substrate," 2008, Applied Physics Letter, vol. 92, No. 22, pp. 221110-1-221110-3.
Schmidt et al., "Demonstration of Nonpolar m-Plane InGaN/GaN Laser Diodes ," 2007, Japanese Journal of Applied Physics, vol. 46, No. 9, L190-L191.
Setlur et al. "Crystal chemistry and luminescence of $Ce^{3+}$-doped $(Lu_2CaMg_2)$-Ca-2(Si, Ge)$O_{12}$ and its use in LED based lighting," Chemistry of Materials 18: 3314-3322 (2006).
Sizov et al., "500-nm Optical Gain Anisotropy of Semipolar (1122) InGaN Quantum Wells," 2009, Applied Physics Express, vol. 2, pp. 071001-1-071001-3.
Tsuda et al., "Blue Laser Diodes Fabricated on m-Plane GaN Substrates," 2008, Applied Physics Express, vol. 1, pp. 011104-011104-03.
Tyagi et al., "Semipolar (1011) InGaN/GaN Laser Diodes on Bulk GaN Substrates," 2007, Japanese Journal of Applied Physics, vol. 46, No. 19, pp. L444-L445.
Wang et al. "Ammonothermal growth of GaN crystals in alkaline solutions," Journal of crystal growth 287:376-380 (Jan. 2006).
Wang et al. "New red $Y_{0.85}Bi_{0.1}Eu_{0.05}V_{1-y}M_yO_4$ (M=Nb, P) phosphors for light-emitting diodes," Physica B: Condensed Matter 403:2071-2075 (Jun. 2008).
Wang et al., "Ammonothermal Synthesis of III-Nitride Crystals," Crystal Growth & Design, 2006, vol. 6, Issue No. 6, pp. 1227-1246.
Wang et al., "Synthesis of Dense Polycrystaline GaN of High Purity by the Chemical Vapor Reaction Process," Journal of Crystal Growth, 2006, vol. 286, pp. 50-54.

(56) References Cited

OTHER PUBLICATIONS

Yamamoto "White LED phosphors: the next step," Proceeding of . SPIE (2010).
Yang et al. "Preparation and luminescence properties of LED conversion novel phosphors $SrZnO_2:Sm$," Materials Letters 62:907-910 (Mar. 2008).
Zhong et al., "Demonstration of High Power Blue-Green Light Emitting Diode on Semipolar (1122) Bulk GaN Substrate," 2007, Electron Letter, vol. 43, No. 15, pp. 825-826.
Zhong et al., "High Power and High Efficiency Blue Light Emitting Diode on Freestanding Semipolar (1122) Bulk GaN Substrate," 2007, Applied Physics Letter, vol. 90, No. 23, pp. 233504-233504-3.
Lide et al., 'Thermal Conductivity of Ceramics and Other Insulating Materials,' CRC Handbook of Chemistry and Physics, 91st Edition, 2010-2011, pp. 12-203 and 12-204.
http://www.matbase.com/material/non-ferrous-metals/other/molybdenum/properties, Data Table for: Non-Ferrous Metals: Other Metals: Molybdenum.
Pattison et al., 'Gallium Nitride Based Microcavity Light Emitting Diodes With 2λ Effective Cavity Thickness', Applied Physics Letters, vol. 90, Issue 3, 031111 (2007) 3pg.
USPTO Office Action for U.S. Appl. No. 12/133,364 dated Nov. 26, 2010.
USPTO Office Action for U.S. Appl. No. 12/133,364 dated Jun. 1, 2011.
USPTO Notice of Allowance for U.S. Appl. No. 12/133,364 dated Oct. 11, 2011.
USPTO Office Action for U.S. Appl. No. 12/133,365 dated Jun. 9, 2011.
USPTO Office Action for U.S. Appl. No. 12/133,365 dated Oct. 18, 2011.
USPTO Office Action for U.S. Appl. No. 12/334,418 dated Apr. 5, 2011.
USPTO Office Action for U.S. Appl. No. 12/334,418 dated Oct. 19, 2011.
USPTO Office Action for U.S. Appl. No. 12/478,736 dated Sep. 27, 2011.
USPTO Office Action for U.S. Appl. No. 12/478,736 dated Feb. 7, 2012.
USPTO Notice of Allowance for U.S. Appl. No. 12/478,736 dated Apr. 23, 2012.
USPTO Office Action for U.S. Appl. No. 12/484,095 dated Nov. 10, 2010.
USPTO Office Action for U.S. Appl. No. 12/484,095 dated Jul. 8, 2011.
USPTO Office Action for U.S. Appl. No. 12/497,969 dated Feb. 2, 2012.
USPTO Office Action for U.S. Appl. No. 12/534,838 dated May 3, 2011.
USPTO Office Action for U.S. Appl. No. 12/534,838 dated Jan. 13, 2012.
USPTO Office Action for U.S. Appl. No. 12/534,838 dated Mar. 20, 2012.
USPTO Notice of Allowance for U.S. Appl. No. 12/534,838 dated Jun. 8, 2012.
USPTO Office Action for U.S. Appl. No. 12/534,844 dated Sep. 16, 2010.
USPTO Office Action for U.S. Appl. No. 12/534,844 dated Feb. 2, 2011.
USPTO Office Action for U.S. Appl. No. 12/534,857 dated Sep. 1, 2010.
USPTO Notice of Allowance for U.S. Appl. No. 12/534,857 dated May 27, 2011.
USPTO Office Action for U.S. Appl. No. 12/546,458 dated Jul. 20, 2011.
USPTO Notice of Allowance for U.S. Appl. No. 12/546,458 dated Nov. 28, 2011.
USPTO Office Action for U.S. Appl. No. 12/556,558 dated Sep. 16, 2010.
USPTO Notice of Allowance for U.S. Appl. No. 12/556,558 dated Mar. 22, 2011.
USPTO Office Action for U.S. Appl. No. 12/556,562 dated Sep. 15, 2010.
USPTO Office Action for U.S. Appl. No. 12/556,562 dated Mar. 21, 2011.
USPTO Notice of Allowance for U.S. Appl. No. 12/556,562 dated Jul. 27, 2011.
USPTO Office Action for U.S. Appl. No. 12/569,337 dated May 9, 2012.
USPTO Office Action for U.S. Appl. No. 12/569,841 dated Dec. 23, 2011.
USPTO Office Action for U.S. Appl. No. 12/634,665 dated Apr. 25, 2012.
USPTO Office Action for U.S. Appl. No. 12/724,983 dated Mar. 5, 2012.
USPTO Notice of Allowance for U.S. Appl. No. 12/754,886 dated May 17, 2012.
USPTO Notice of Allowance for U.S. Appl. No. 12/754,886 dated Jun. 5, 2012.
USPTO Notice of Allowance for U.S. Appl. No. 12/754,886 dated Jun. 20, 2012.
USPTO Office Action for U.S. Appl. No. 12/785,404 dated Mar. 6, 2012.
Copel et al., 'Surfactants in Epitaxial Growth', Physical Review Letters, Aug. 7, 1989, vol. 63, No. 6, p. 632-635.
Lu et al., 'Structure of the CI-passivated GaAs(111) surface', Physical Review B, Nov. 15, 1998, vol. 58, No. 20, pp. 13820-13823.
Massies et al., 'Surfactant mediated epitaxial growth of InxGal-xAs on GaAs (001)', Applied Physics Letters, vol. 61, No. 1, Jul. 6, 1992, pp. 99-101.
Sumiya et al., 'High-pressure synthesis of high-purity diamond crystal', Diamond and Related Materials, 1996, vol. 5, pp. 1359-1365.
Communication from the Chinese Patent Office re 200980134876.2 dated Jul. 3, 2013.
Communication from the Polish Patent Office re P394857 dated Aug. 14, 2013.
USPTO Office Action for U.S. Appl. No. 12/133,365 dated Aug. 21, 2013, 29 pages.
USPTO Office Action for U.S. Appl. No. 12/334,418 dated Sep. 17, 2013, 27 pages.
USPTO Office Action for U.S. Appl. No. 12/497,969 dated Sep. 6, 2013, 21 pages.
USPTO Office Action for U.S. Appl. No. 12/636,683 dated Aug. 16, 2013, 16 pages.
USPTO Office Action for U.S. Appl. No. 12/697,171 dated Jun. 20, 2013, 17 pages.
USPTO Office Action for U.S. Appl. No. 12/697,171 dated Aug. 20, 2013, 17 pages.
USPTO Office Action for U.S. Appl. No. 13/472,356 dated Dec. 9, 2013, 11 pages.
USPTO Office Action for U.S. Appl. No. 12/497,969 dated Jul. 5, 2012.
USPTO Office Action for U.S. Appl. No. 12/534,843 dated Sep. 10, 2012.
USPTO Notice of Allowance for U.S. Appl. No. 12/534,849 dated Jul. 31, 2012.
USPTO Notice of Allowance for U.S. Appl. No. 12/785,404 dated Jul. 16, 2012.
USPTO Office Action for U.S. Appl. No. 13/179,346 dated Aug. 17, 2012.
USPTO Notice of Allowance for U.S. Appl. No. 13/425,304 dated Aug. 22, 2012.
Choi et al., '2.5λ microcavity InGaN light-emitting diodes fabricated by a selective dry-etch thinning process', Applied Physics Letters, 2007, 91(6), 061120.
Weisbuch et al., 'Recent results and latest views on microcavity LEDs', Light-Emitting Diodes: Research, Manufacturing, and Applications VIII, ed. By S.A. Stockman et al., Proc. SPIE, vol. 5366, p. 1-19 (2004).
USPTO Notice of Allowance for U.S. Appl. No. 12/478,736 dated Oct. 9, 2012.

(56) References Cited

OTHER PUBLICATIONS

USPTO Notice of Allowance for U.S. Appl. No. 12/569,337 dated Nov. 15, 2012.
USPTO Office Action for U.S. Appl. No. 12/569,844 dated Oct. 12, 2012.
USPTO Office Action for U.S. Appl. No. 12/634,665 dated Oct. 1, 2012.
USPTO Office Action for U.S. Appl. No. 12/891,668 dated Sep. 25, 2012.
USPTO Office Action for U.S. Appl. No. 13/025,833 dated Jul. 12, 2012.
USPTO Office Action for U.S. Appl. No. 13/041,199 dated Nov. 30, 2012.
USPTO Office Action for U.S. Appl. No. 13/175,739 dated Dec. 7, 2012.
USPTO Office Action for U.S. Appl. No. 13/179,346 dated Dec. 13, 2012.
USPTO Office Action for U.S. Appl. No. 13/226,249 dated Oct. 10, 2012.
USPTO Notice of Allowance for U.S. Appl. No. 12/534,843 dated Jan. 24, 2013.
Communication from the Polish Patent Office re P394857 dated Jan. 22, 2013, 2 pages.
USPTO Notice of Allowance for U.S. Appl. No. 12/634,665 dated Feb. 15, 2013.
USPTO Office Action for U.S. Appl. No. 13/041,199 dated Mar. 12, 2013.
USPTO Notice of Allowance for U.S. Appl. No. 13/226,249 dated Feb. 21, 2013.

* cited by examiner

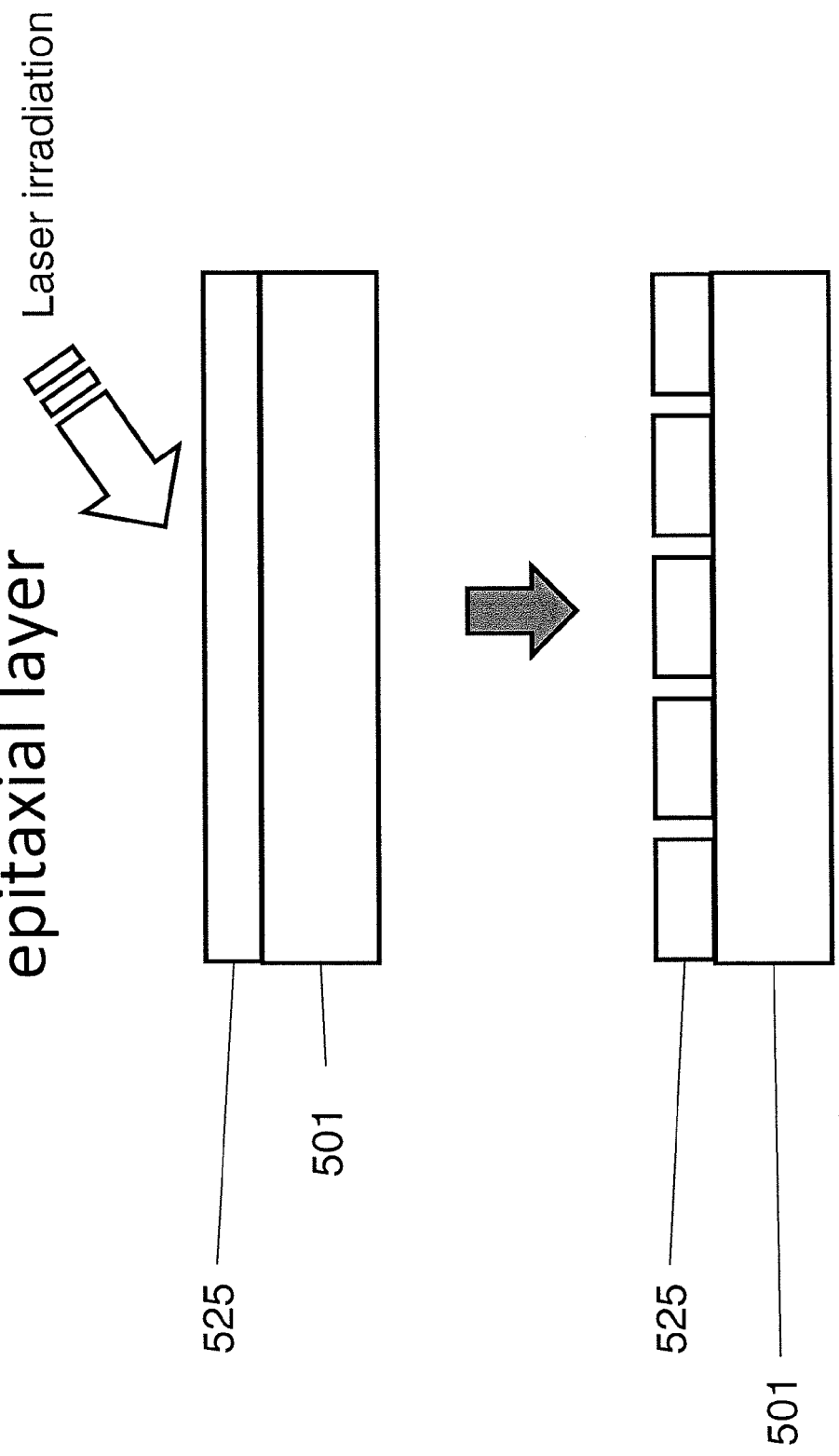
Fig. 5: Holographic patterning of substrate or epitaxial layer

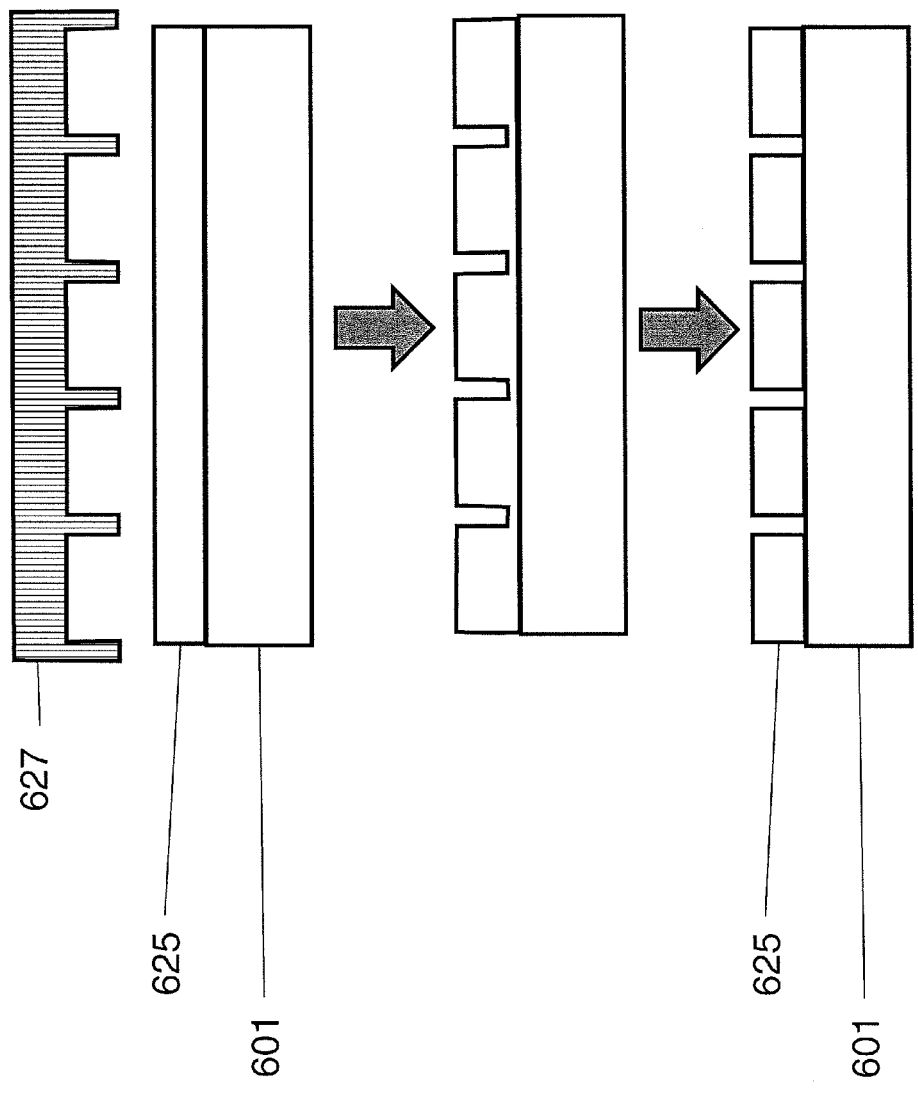
Fig. 6: Nanoimprint lithography of n-doped layer

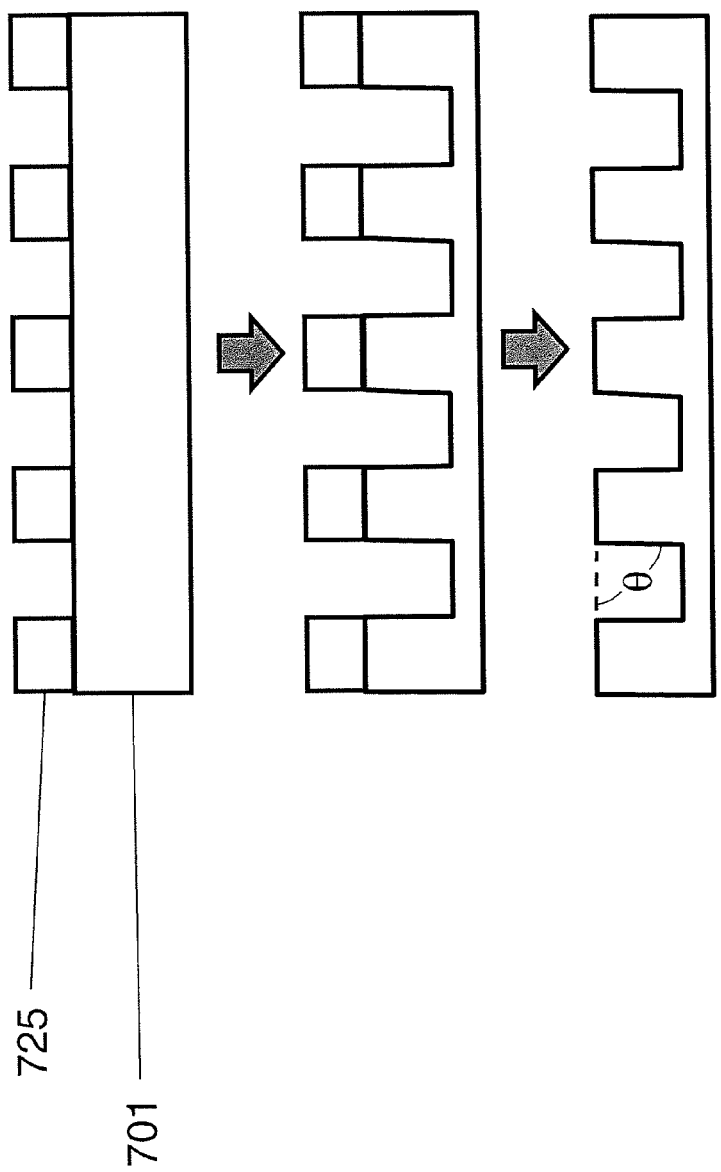
Fig. 7: Etching of patterned substrate or epitaxial layer

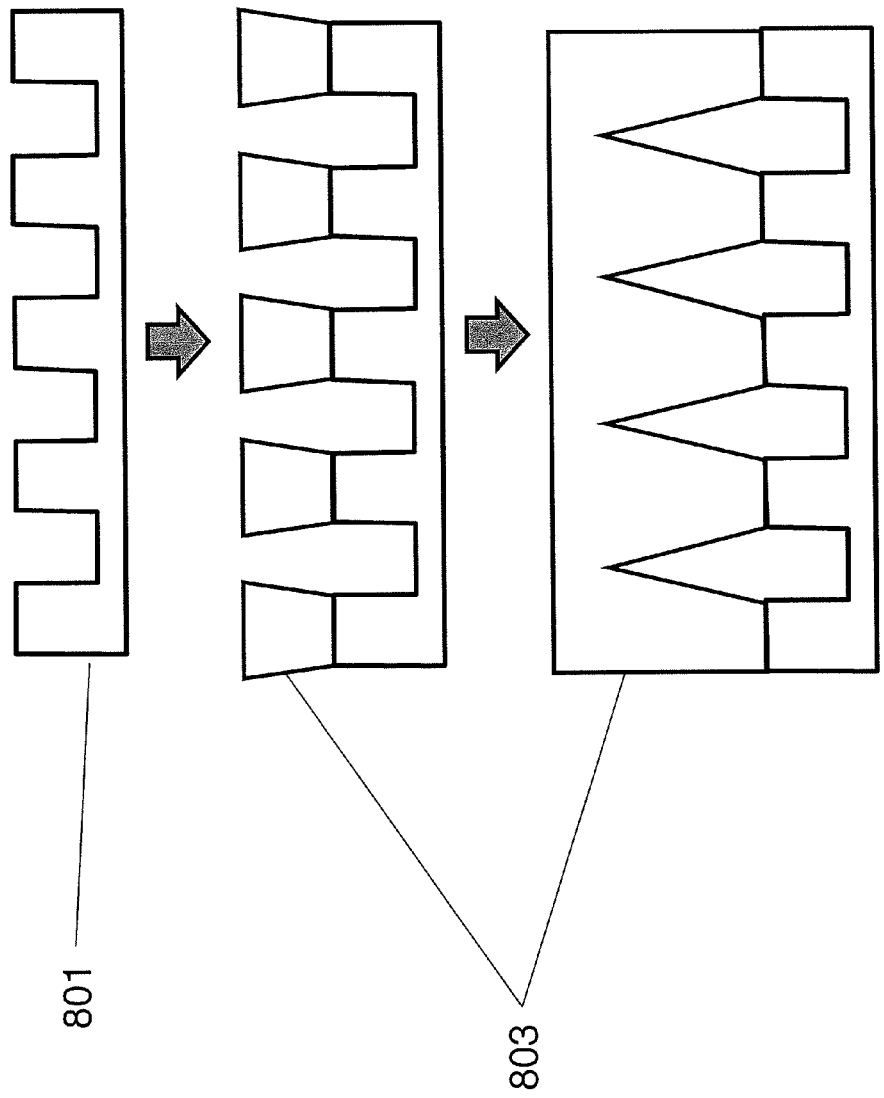
Fig. 8: Growth of epitaxial layer on patterned substrate or epitaxial layer

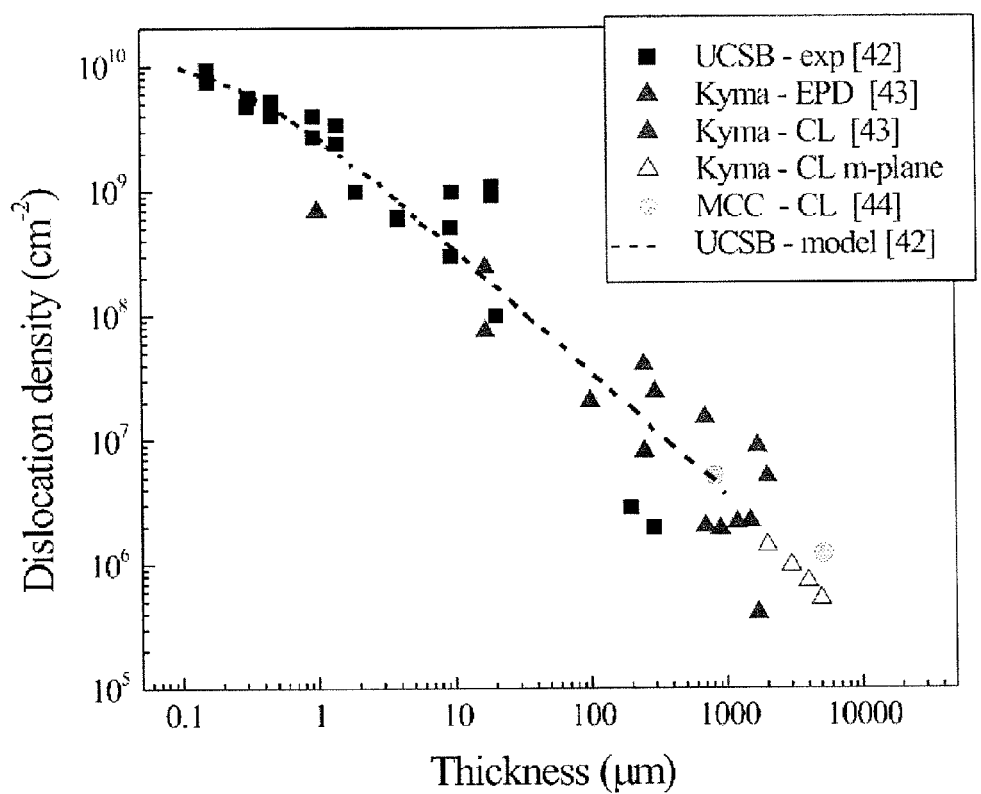
Figure 9. Dislocation density as a function of the thickness of GaN layers [T. Paskova and K. R. Evans, IEEE J. Sel. Topics Quantum Electronics 15, 1041 (2009)].

METHOD OF MAKING BULK INGAN SUBSTRATES AND DEVICES THEREON

CROSS-REFERENCES TO RELATED APPLICATIONS

This Non-Provisional patent application is based on and claims priority to Provisional Patent Application No. 61/392,565, titled METHOD OF MAKING BULK InGaN SUBSTRATES AND DEVICES THEREON, filed on Oct. 13, 2010. This provisional application is incorporated herein by reference for all purposes.

BACKGROUND OF THE INVENTION

The present invention relates generally to techniques using bulk gallium and nitrogen containing substrates. More particularly, the present invention provides a method and device using bulk gallium and nitrogen containing substrates configured in a semi-polar orientation. Merely by way of example, the invention has been applied to use bulk GaN substrates to form overlying epitaxial regions in a bi-axially relaxed state, but it would be recognized that the invention has a broader range of applicability.

Today's state-of-the-art visible-spectrum light-emitting diodes (LEDs) and laser diodes (LDs) in the ultraviolet to green (380-550 nm) regime are based on InGaN active layers grown pseudomorphic to wurtzite GaN. This is true whether the growth substrate is GaN itself, or a foreign substrate such as sapphire or SiC, since in the latter cases GaN-based nucleation layers are employed. To our knowledge, successful demonstration of InGaN-based nucleation layers has not been achieved, and may not be possible given the growth morphology evolution of low-temperature InGaN layers on foreign substrates. FIG. 1 illustrates the energy bandgap vs. basal-plane (a) lattice constant for a Wurtzite (Al, In, Ga)N system, with regions indicated for visible spectrum emission based on both strained-to-GaN and relaxed, InGaN. Reference number 110 represents the basal plane lattice constant for pseudomorphic $In_xGa_{1-x}N$/GAN, and 120 represents the basal plane lattice constant for relaxed $In_xGa_{1-x}N$.

The resulting built-in stress within the InGaN active layers can be problematic for achieving high quality material and good device operation as the InN mole fraction increases, a requirement for longer wavelength devices. For c-plane grown devices, increasing InN increases the built-in electric fields across the active layers due to spontaneous and piezo-electric polarization fields, reducing the overlap between electrons and holes and decreasing radiative efficiency. Moreover, there is evidence for material breakdown as the stress level becomes too high, resulting in so-called "phase separation," beyond a critical limit of a certain InN mole fraction combined with a certain layer thickness. See, e.g. N. A. El-Masry, E. L. Piner, S. X. Liu, and S. M. Bedair, "Phase separation in InGaN grown by metalorganic chemical vapor deposition," Appl. Phys. Lett., vol. 72, pp. 40-42, 1998. Such a limit is observed for InGaN layers of about 10% InN grown more than 0.2 um thick, for example, resulting in "black" or "grey" wafers.

Non-polar (1-100), (11-20), and semi-polar planes of GaN can address some of the problems above. In particular, for certain growth planes the combined spontaneous and piezo-electric polarization vector can be reduced to zero or near-zero, eliminating the electron-hole overlap problem prevalent in c-plane-based devices. Also, improved material quality with increased InN can be observed, such as demonstrated for semi-polar material which has resulted in continuous-wave (CW) true-green LDs for the first time. See, e.g. Y. Enya et al., "531 nm green lasing of InGaN based laser diodes on semi-polar {20-21} free-standing GaN substrates," Appl. Phys. Express 2, 082101, 2009 and J. W. Raring et al., "High-power high-efficiency continuous-wave InGaN laser diodes in the violet, blue, and green wavelength regimes," SPIE Photonics West 7602-43, 2010. The performance of longer-wavelength devices grown on these structures, however, still suffers considerably compared to that of shorter-wavelength counterparts. In addition, it is not clear that these growth plane orientations would eliminate the materials quality problems associated with strain. Recent characterization of semi-polar (Al,In,Ga)N heterostructures reveals the formation of a large density of misfit dislocations at heterointerfaces between AlGaN and GaN. See, for example, A. Tyagi et al., "Partial strain relaxation via misfit dislocation generation at heterointerfaces in (Al,In)GaN epitaxial layers grown on semipolar (11-22) GaN free standing substrates," Appl. Phys. Lett. 95, 251905, 2009. These dislocations may act as non-radiative recombination centers as well as potential degradation mechanisms which may prevent long-life operation necessary for applications such as solid-state lighting. Finally, the best-reported external quantum efficiencies versus wavelength for LEDs show a strong reduction with increasing InN mole fraction, regardless of growth plane orientation, as illustrated by FIG. 2. FIG. 2 illustrates external quantum efficiency vs. peak emission wavelength for visible-spectrum light-emitting diodes (After S. Denbaars, DOE SSL Workshop presentation, February 2010). Reference number 210 is an efficiency curve for $In_xGa_{1-x}N$ LEDs grown on a c-plane substrate. Reference number 220 is an efficiency curve representing $(Al_xGa_{1-x})_{.52}In_{.48}P$ LEDs. Reference number 230 represents the efficiency of LEDs (nonpolar substrate), and reference numbers 232, 234, 236, and 238 each represents the efficiency of $In_xGa_{1-x}N$ LEDs (semipolar substrates). Reference number 240 is an efficient curve for LEDs fabricated by UCSB.

BRIEF SUMMARY

According to the present invention, techniques related generally to using bulk gallium and nitrogen containing substrates are provided. More particularly, the present invention provides a method and device using bulk gallium and nitrogen containing substrates configured in a semi-polar orientation. Merely by way of example, the invention has been applied to use bulk GaN substrates to form overlying epitaxial regions in a bi-axially relaxed state, but it would be recognized that the invention has a broader range of applicability.

In this invention we activate the (0001)/1/3<11-20> slip planes in GaN by using semi-polar oriented material and controlled stress at heterointerfaces to form a relaxed InGaN layer which will become a seed for growth of a relaxed InGaN substrate or layer. In one embodiment, a GaN growth surface of a predetermined growth plane (other than c-plane) is provided. This may be accomplished by growing thick c-oriented boules of GaN by techniques such as hydride vapor-phase epitaxy (HVPE) and cutting these boules along predetermined orientations to provide a semi-polar GaN growth surfaces. Next, an InGaN seed layer of a specified InN mole fraction is grown upon the GaN layer by a desired technique such as metal-organic chemical vapor deposition (MOCVD), ammonothermal growth, molecular beam epitaxy (MBE), HVPE, or other methods. The predetermined growth plane combined with stress at the InGaN/GaN heterointerface results in the formation of a network of dislocations which allows the InGaN seed layer to relax. Continued growth of InGaN (by any one or a combination of the methods) results in a thicker, relaxed, InGaN layer with the dislocation density becoming reduced as layer thickness increases, due to annihilation of colliding dislocations. Once the total dislocation density is reduced to a level of about $10^8$ cm$^{-2}$, the InGaN layer is suitable to use for LED device fabrication. To reduce the dislocation density further, the total InGaN layer thickness is increased, and at a dislocation density level of $10^7$ cm$^{-2}$ or less, may be suitable for the growth of LD devices. The original GaN growth substrate may be removed at several points along the process flow.

In a specific embodiment, the present invention provides a method for forming at least one relaxed epitaxial AlxInyGa(1-x-y)N layer. The method includes providing a substrate having a semipolar surface orientation. In a preferred embodiment, the substrate may be GaN or other gallium and nitrogen containing material and the like. The method includes forming at least one epitaxial AlxInyGa(1-x-y)N layer having a thickness of at least 100 nanometers formed overlying at least a portion of the semipolar surface orientation such that a plurality of misfit dislocations are included in one or more portions of the thickness to reduce a bi-axial strain in the thickness to a relaxed state. The term "relaxed state" is ordinarily understood to mean substantially free from strain or in the preferred embodiment bi-axial strain. In a preferred embodiment, the forming comprising providing a predetermined thickness in the bi-axial strain and thereafter providing the plurality of misfit dislocations to reduce the bi-axial stain to or toward the relaxed state. The predetermined thickness is a critical thickness between a strained state and the relaxed state, which is substantially relaxed bi-axially. Of course, there can be other variations, modifications, and alternatives.

In an alternative specific embodiment, the present invention provides a device. The device includes a semi-polar bulk GaN substrate having a surface orientation within about 1 degree of one of (4 3 –7 1), (3 2 –5 1), (2 1 –3 1), (3 1 –4 2), (4 1 –5 3), (8 1 –9 8), and (3 0 –3 4), among others. The device includes at least one active layer comprising $Al_xIn_yGa_{1-x-y}N$, where 0≤x, y, x+y≤1. Preferably, the active layer has a thickness between about 1 nanometer and about 100 nanometer and a concentration of threading dislocations less than about $10^8$ cm$^{-2}$. In a specific embodiment, the device is selected from among a light emitting diode, a laser diode, a photodetector, an avalanche photodiode, a transistor, a rectifier, and a thyristor; one of a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascode switch, an inner sub-band emitter, a quantum well infrared photodetector, a quantum dot infrared photodetector, a solar cell, and a diode for photoelectrochemical water splitting and hydrogen generation, among others.

In an alternative specific embodiment, the present invention provides a method for forming a relaxed epitaxial AlxInyGa(1-x-y)N layer. The method includes providing a substrate having an orientation within about 5 degrees of a c-plane and forming at least one epitaxial AlxInyGa(1-x-y)N layer with a thickness of at least 100 nanometers such that a plurality of misfit dislocations are included to reduce a bi-axial strain within the thickness or form a relaxed state.

One or more benefits may be achieved using one or more of the specific embodiments. As an example, the present device and method provides a substantially relaxed region for device fabrication using a gallium and nitrogen containing substrate. In a specific embodiment, the present method and device can be made using conventional techniques and is cost effective. In a preferred embodiment, dislocations are introduced into a thickness of the epitaxial layer to cause relaxation that is substantially biaxial. Depending upon the embodiment, one or more of these benefits can be achieved. These and other benefits are further described throughout the present specification and more particularly below.

The present invention achieves these benefits and others in the context of known process technology. However, a further understanding of the nature and advantages of the present invention may be realized by reference to the latter portions of the specification and attached drawings.

BRIEF DESCRIPTION OF THE DRAWINGS

FIG. 5 illustrates how photoresist may be developed by exposure to expanded laser beams incident at a preselected angle;

FIG. 6 illustrates how a mask with a predetermined lattice constant is formed by nanoimprint lithography;

FIG. 7 illustrates how a desired pattern is transferred from the photoresist to the substrate or epitaxial layer by etching;

FIG. 8 illustrates formation of an epitaxial layer on a patterned substrate; and FIG. 9 illustrates how when an epitaxial layer is grown thick enough a substantial fraction of dislocations annihilate one another.

DETAILED DESCRIPTION

According to the present invention, techniques related generally to using bulk gallium and nitrogen containing substrates are provided. More particularly, the present invention provides a method and device using bulk gallium and nitrogen containing substrates configured in a semi-polar orientation. Merely by way of example, the invention has been applied to use bulk GaN substrates to form overlying epitaxial regions in a bi-axially relaxed state, but it would be recognized that the invention has a broader range of applicability.

Figure 1:
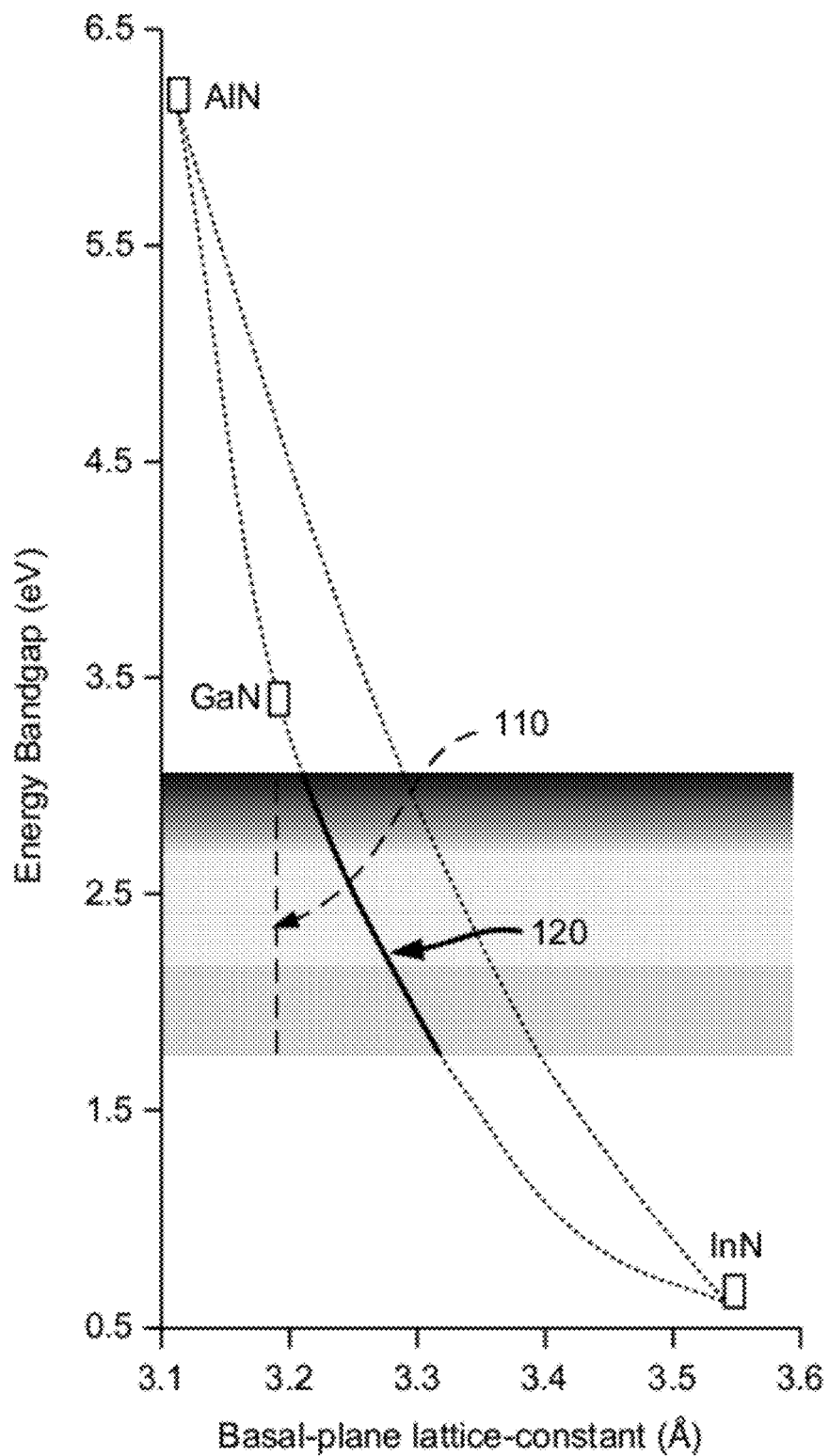
FIG. 1 is a diagram illustrating the relationship between energy bandgap and basal-plane lattice constant for strained InGaN and relaxed InGaN.
Figure 2:
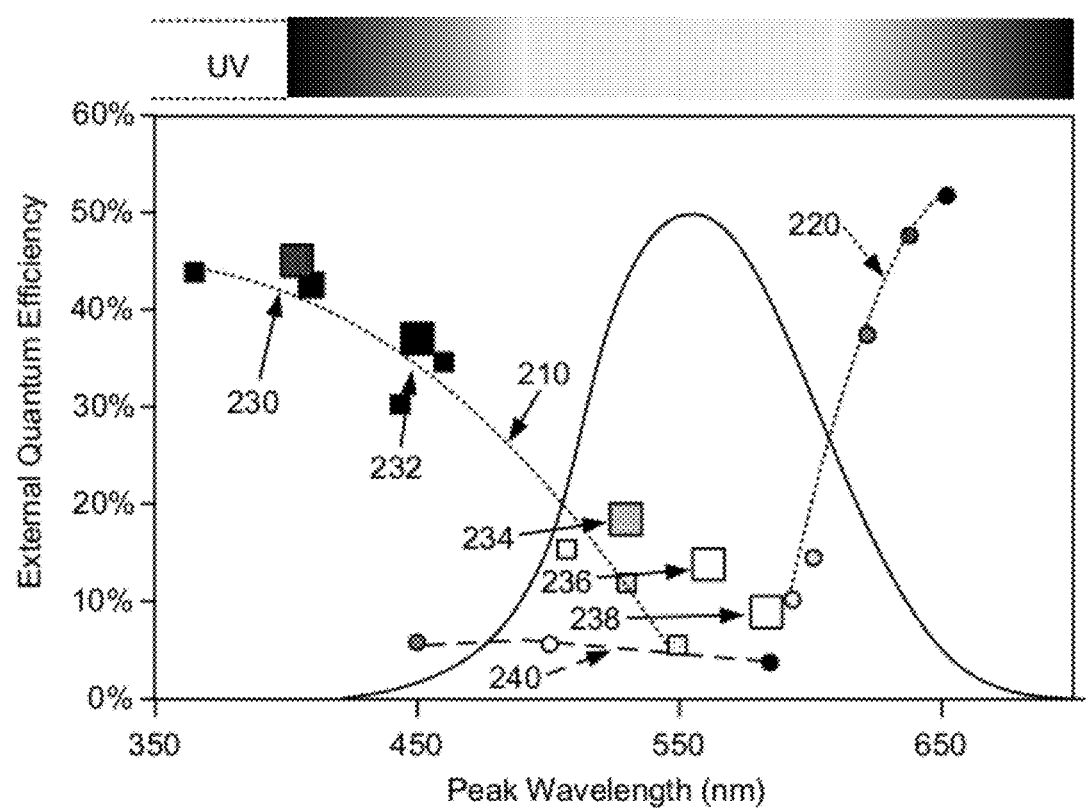
FIG. 2 is a diagram illustrating the relationship between external quantum efficiency and emission wavelength for LEDs as influenced by increasing InN mole fraction.
Figure 3:
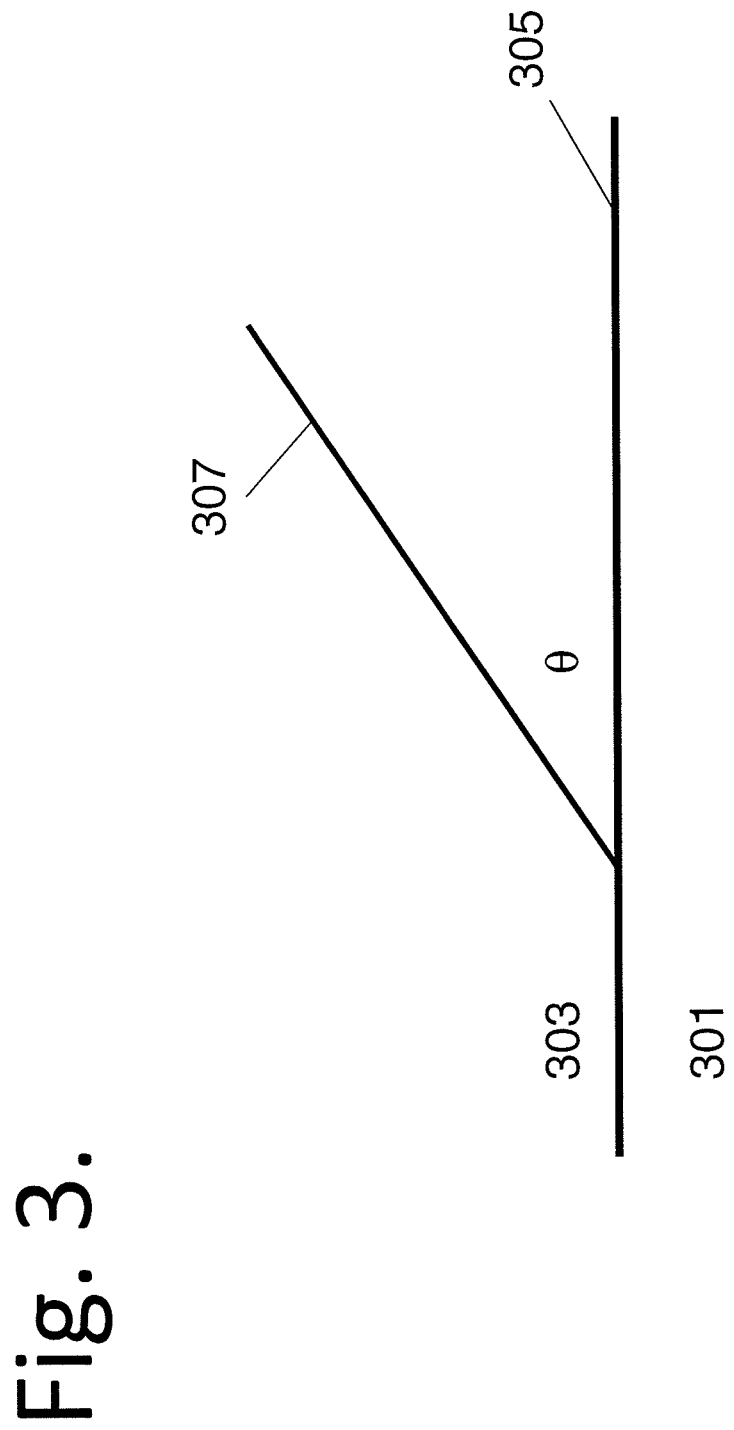
FIG. 3 is a diagram of an epitaxial layer on a substrate.

FIG. 3 is a diagram of an epitaxial layer 303 on a substrate 301. In one embodiment, substrate 301 comprises bulk GaN. In other embodiments, substrate 301 comprises AlN, sapphire, silicon carbide, gallium arsenide, $MgAl_2O_4$ spinel, ZnO, BP, $ScAlMgO_4$, $YFeZnO_4$, MgO, $Fe_2NiO_4$, $LiGa_5O_8$, $Na_2MoO_4$, $Na_2WO_4$, $In_2CdO_4$, $LiAlO_2$, $LiGaO_2$, $Ca_8La_2(PO_4)_6O_2$, or the like. Preferably, substrate 301 comprises bulk GaN with a surface dislocation density below about $10^7$ cm$^{-2}$. Epitaxial layer 303 may comprise $Al_xIn_yGa_{(1-x-y)}N$, where 0≤x, y≤1. In a preferred embodiment, at least one of x and y is between 0.01 and 0.50. The surface 305 of substrate 301 may have a semi-polar orientation, that is, may form an angle θ with respect to the (0001) c-plane in substrate 301 or with respect to the (0001) c-plane 307 in epitaxial layer 303 that is between 0 and 90 degrees. The crystallographic orientation of substrate surface 305 may be specified by Miller-Bravais indices (h k i l), where i=−(h+k), and where l and at least one of h and k are nonzero. The plane of the page in FIG. 3 is perpendicular to both surface 301 and c-plane 307.

Some semi-polar surface orientations, for example, {1 1 −2 2}, may be generated by tilting the [0 0 0 1] c axis toward an <1 1 −2 0> a axis. Other semi-polar surface orientations, for example, {1 0 −1 −1}, {1 0 −1 2}, {1 0 −1 3}, and {2 0 −2 1}, may be generated by tilting the [0 0 0 1] c axis toward an <1 0 −1 0> m axis. A number of authors have investigated epitaxial AlInGaN layers on bulk GaN substrates of such orientations. Still other semi-polar surface orientations may be generated by tilting the [0 0 0 1] c axis toward an axis intermediate in orientation intermediate between an a axis and an m axis. Such lower-symmetry orientations have not received much attention to date.

Figure 4:
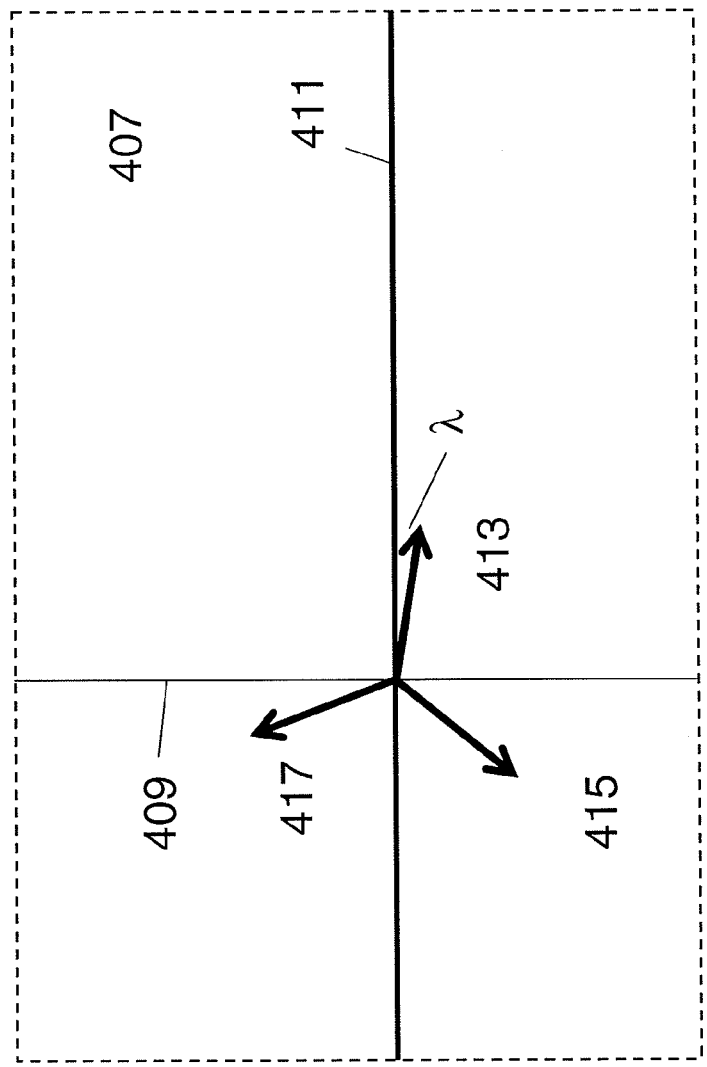
FIG. 4 is a plan-view diagram of surface projected onto c-plane.

FIG. 4 is a schematic plan-view diagram of surface 305, projected onto c-plane 407. Surface 305 intersects c-plane 407 along line 409. Plane 411, projecting out of the page in FIG. 4, is perpendicular to both surface 305 and c-plane 407 and corresponds to the plane of the page in FIG. 3. Oriented within c-plane 407 lie the three a lattice vectors 413, 415, and 417. One of the a directions, for example, $a_3$, may be closest in orientation to the normal of line 409, forming angle $\lambda$ with respect to plane 411. In the case where the surface is generated by tilting toward an m axis, then two axes will be equidistant to plane 411 and $\lambda$ will be 30 degrees.

In the nitrides, slip may occur relatively readily in the (0 0 0 1) basal plane, or c-plane, with a Burger's vector of ⅓ [1 1 −2 0] or $a_3$. See A. Tyagi et al., "Partial strain relaxation via misfit dislocation generation at heterointerfaces in (Al,In)GaN epitaxial layers grown on semipolar (11-22) GaN free standing substrates," Appl. Phys. Lett. 95, 251905, 2009 and Z. H. Wu et al., Appl. Phys. Lett. 96, 071909 (2010). Strain relaxation may occur by formation of misfit dislocations and slip motion of existing threading and/or misfit dislocations along (0 0 0 1) glide planes. Strain relaxation may also occur by formation of misfit dislocations with other orientations, dislocation climb, formation of stacking faults, cracking, roughening of the growth surface, and the like. In some or many cases the latter mechanisms for strain relaxation, however, may give rise to inferior crystallographic quality of the epitaxial layer. This invention seeks to maximize the extent of strain relaxation by generation of misfit dislocations.

Referring to FIG. 3 and FIG. 4, note that relaxation by introduction of a misfit dislocation along line 409 with Burger's vector $a_3$ (along 413 in FIG. 4) may produce relaxation of magnitude $b=a_3$ in c-plane 407, projection b cos $\theta$ cos $\lambda$, along surface 305 in the plane of the page of FIG. 3, and projection b sink along surface 305 out of the plane of the page of FIG. 3. In the case of tilt of the semi-polar surface from the c axis toward an a axis, $\lambda=0$ and generation of misfit dislocations in a single a direction may tend to produce relaxation in the direction along the c-axis projection but not the orthogonal direction, as observed by Tyagi et al. cited above. In the case of tilt of the semi-polar surface from the c axis toward an m axis, $\lambda=30°$ and generation of misfit dislocations may be expected to occur with approximately equal probability along two a directions. For a given lattice mismatch, however, the magnitude of the stress along the a axes may be reduced from the case where slip only occurs along one a direction, and relaxation along two orthogonal surface directions may or may not be similar in magnitude.

Generation of an array of misfit dislocations, with a Burger's vector b equal to a, a line direction along {1 −1 0 0} and an average separation of d, may be expected to produce an in-plane (cf. FIG. 3) relaxation $\delta_\parallel$ equal to (b/d) cos $\theta$ cos $\lambda$, and an out-of-plane relaxation $\delta_\perp$ of (b/d) sink. If the lattice mismatch is approximately equal in the directions parallel to the page and perpendicular to the page in FIG. 3, it may be desirable to have the in-plane and out-of-plane relaxations be approximately equal. If the lattice mismatch values in the two directions are not the same, it may be desirable to produce more relaxation in one direction than in the other, so as to produce an epitaxial layer that is fully relaxed in both directions.

Relaxation along surface 305 may be approximately equiaxial if cos $\theta$=tan $\lambda$. This relation will hold for a single symmetry-equivalent set of tilt angles $\lambda$ for a given off-c-axis tilt angle $\theta$. For wurtzite structures with a near-ideal c/a ratios that are fairly similar between epitaxial layer and substrate, such as $Al_xIn_yGa_{(1-x-y)}N$ on GaN, near-equiaxed relaxation may occur by generation of misfit dislocations for semi-polar surface orientations such as (4 3 −7 1), (3 2 −5 1), (2 1 −3 1), (3 1 −4 2), (4 1 −5 3), (8 1 −9 8), and (3 0 −3 4). These surfaces are tilted from the c axis by angles $\theta$ between about 85° and about 55° and have values of $\lambda$ between about 5° and 30°.

As one example, consider growth of an epitaxial layer of $In_{0.2}Ga_{0.8}N$ on the (2 1 −3 1) surface of bulk GaN. For this geometry $\theta$ is about 79° and $\lambda$ is about 11°. Assuming Vegard's law, the lattice constants for the epitaxial layer are about 2% larger than those for GaN. Full relaxation of the strain may be achieved with misfit dislocations laterally separated by about 6 Å.

In one set of embodiments, a device is fabricated on a gallium-containing nitride substrate 305 whose semi-polar surface orientation is chosen such that cos $\theta$=tan $\lambda$. In a specific embodiment, the orientation of gallium-containing nitride substrate 305 is selected to be within about 5 degrees, within about 2 degrees, within about 1 degree, or within about 0.5 degree from one of (4 3 −7 1), (3 2 −5 1), (2 1 −3 1), (3 1 −4 2), (4 1 −5 3), (8 1 −9 8), and (3 0 −3 4). One or more epitaxial and/or active layers may be deposited on the surface of substrate 305. In a preferred embodiment, the at least one epitaxial layer comprises $Al_xIn_yGa_{1-x-y}N$, where 0≤x, y, x+y≤1. An epitaxial or active layer may be subjected to a treatment, for example, a thermal treatment, that initiates the formation of misfit dislocations and avoids or minimizes the formation of threading dislocations in the active layer. The at least one active layer may have a value of y that is greater than 0.05, greater than 0.10, greater than 0.15, greater than 0.20, greater than 0.25, greater than 0.30, greater than 0.35, greater than 0.40, greater than 0.45, or greater than 0.50.

The active layer may be deposited by metalorganic chemical vapor deposition (MOCVD), by molecular beam epitaxy (MBE), by hydride vapor phase epitaxy (HVPE), or by other methods that are known in the art. The active layer may have a thickness between about 1 nanometer and about 100 nanometers. The active layer also may comprise a stack or superlattice of layers with alternating compositions. The active layer may have a concentration of threading dislocations less than about $10^7$ cm$^{-2}$, less than about $10^6$ cm$^{-2}$, less than about $10^5$ cm$^{-2}$, less than about $10^4$ cm$^{-2}$, or less than about $10^3$ cm$^{-2}$. At least one electrical contact is preferably deposited. In a preferred embodiment, the device is processed further to form a light emitting diode (LED) or a laser diode. In other embodiments, the device will be configured to be a photodetector, an avalanche photodiode, a transistor, a rectifier, and a thyristor; one of a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascode switch, an inner sub-band emitter, a quantum well infrared photodetector, a quantum dot infrared photodetector, a solar cell, or a diode for photoelectrochemical water splitting and hydrogen generation.

In another set of embodiments, at least one epitaxial layer is grown on a substrate with a surface orientation within about 5 degrees of c-plane, and at least one of the substrate and at least one epitaxial layer are patterned to facilitate atom transport along glide planes to form misfit dislocations. If desired, a pattern, for example to provide stripes, bottom pillars, holes, or a grid, is formed on the substrate or on an epitaxial layer on the substrate by conventional photolithography.

In one set of embodiments, illustrated in FIGS. 5 and 6, a mask with a predetermined lattice constant may be formed by holographic photolithography. Photoresist 525 may be spin-coated on substrate or epitaxial layer 501 by methods that are known in the art. Suitable examples of the photoresist are Shipley SPR-3001, AZ-1518, and KMR-747.

Referring to FIG. 5, photoresist 525 may be developed by exposure to one or more expanded laser beams incident at a preselected angle. After an exposure at one position, the photoresist may be rotated by 90 degrees or by 60 degrees and/or by 120 degrees and exposed again. Upon washing with a suitable developer [for example, AZ-400K], a square or triangular mask with a predetermined periodicity is formed. The periodicity, or lattice constant of the pattern, may be controlled by changing the wavelength of the laser and the incidence angle during the exposure. In one specific embodiment, a He—Cd laser, operating at a wavelength of 325 nm, is used to expose the photoresist. In one specific embodiment, a single exposure is performed, forming a one-dimensional lattice of long stripes. In another specific embodiment, the photoresist is rotated by 60 degrees and/or 120 degrees and the wavelength and incident angle are left unchanged, so as to produce a triangular lattice. In another specific embodiment, the photoresist is rotated by 90 degrees and the wavelength and incident angle are left unchanged, so as to produce a square lattice. The pitch, or lattice constant, of the pattern may be chosen to be between about 10 nm and about 1000 nm for efficient formation of misfit dislocations.

In another embodiment, the mask with a predetermined lattice constant is formed by nanoimprint lithography, as shown in FIG. 6. To fabricate a nanoimprint master 627, a photoresist may be applied to a nanoimprint substrate. The nanoimprint substrate may constitute a silicon wafer with a 6-nm-thick $SiO_2$ coating. In other embodiments, the nanoimprint substrate comprises at least one of quartz, fused silica, sapphire, silicon carbide, and diamond. A diamond substrate may be fabricated by chemical vapor deposition (CVD) or other suitable techniques. The photoresist may be exposed at two incident angles (or more), as described above, to form a patterned photoresist on the silicon wafer. In another embodiment, the photoresist for the nanoimprint master is patterned by electron-beam lithography, rather than by holographic lithography.

Two consecutive etching treatments, for example, by reactive ion etching, can be used to transfer the photonic crystal pattern from the photoresist to the $SiO_2$ layer and then into the silicon wafer or other nanoimprint substrate. The final depth of the pattern in the silicon wafer or other nanoimprint substrate surface may be between about 100 nm and about 500 nm. In some embodiments, a different dry etch chemistry is selected to etch the nanoimprint substrate than is used to etch the photoresist and/or a $SiO_2$ layer. Next, referring again to FIG. 6, a photoresist layer 625 may be deposited onto the substrate or epitaxial layer 601. One example of a suitable photoresist for this process is Nanonex NXR-1010. The photoresist is then imprinted by the nanoimprint master 627 at a predetermined temperature and pressure. In one embodiment, the temperature is about 130 degrees Celsius and the pressure is about 300 pounds per square inch. The thin layer of polymer left in the bottom of hollows produced by the imprinting process may then be etched away by performing reactive ion etching with $O_2$.

Referring to FIG. 7, the desired pattern is then transferred from the photoresist to the substrate or epitaxial layer by etching. The etching conditions preferably are selected to maintain relatively straight sidewalls, with an angle θ with respect to the surface between about 60 degrees and about 90 degrees. In one implementation, the sidewall angle is between about 75 degrees and about 90 degrees. In some embodiments, the pattern is transferred by reactive ion etching with $Cl_2$. The widths of the channels produced by etching may be between about 5 nm and about 1000 nm, and the depths between about 10 nm and about 100 microns, or between about 100 nm and about 10 microns.

In an alternative embodiment, the desired pattern is transferred to the substrate or epitaxial layer by masking. A suitable mask material, for example, silica ($SiO_2$), silicon nitride ($Si_3N_4$), tungsten, gold, or the like, is deposited onto the patterned photoresist. The photoresist is then dissolved, removing excess masking material, except above the original openings in the patterned photoresist.

Following the patterning process, at least one epitaxial layer 803 is deposited on the patterned substrate or patterned epitaxial layer 801, as shown schematically in FIG. 8. During the initial stages of growth of epitaxial layer 803 the isolated nano- or micro-islands may be fully strained. As the thickness of epitaxial layer exceeds the Matthews Blakeslee critical thickness, at some point relaxation by formation and/or migration of misfit dislocations is expected to occur. In this case the (0 0 0 1) glide planes are parallel to the substrate-epitaxial-layer-interface, so dislocation motion and atom migration are expected to occur from the periphery of the nano- or micro-islands inward. As the thickness of epitaxial layer 803 continues to increase during deposition, the areas over the etched channels or masks begins to close off by lateral growth, and subsequent growth occurs on a coalesced layer. In some embodiments relaxation of the lattice mismatch strain goes to completion prior to coalescence.

In still another embodiment, the substrate is macroscopically patterned, with the pitch of the pattern between approximately 1 micron and about 1 millimeter. The pattern may comprise regions where the local crystallographic orientation is nonpolar or semipolar, rather than c-plane. Growth on these regions is expected to exhibit similar relaxation behavior as growth on a flat surface of the given orientation.

In one specific embodiment, a single epitaxial layer of the desired composition is grown directly on substrate 301. In another set of embodiments, a series of epitaxial layers of graded compositions, where each layer is much thicker than the Matthews-Blakeslee critical thickness, are grown on substrate 301. For example, a layer of $In_{0.05}Ga_{0.95}N$ at least 1 micron thick, at least 10 microns thick, or at least 100 microns thick, may be deposited on the GaN substrate, followed by similarly-thick layers of $In_{0.1}Ga_{0.9}N$, $In_{0.15}Ga_{0.55}N$ and $In_{0.2}Ga_{0.8}N$. The layer thicknesses may be similar to one another, or one or more layers may be substantially thicker than other layers.

In another embodiment, a series of epitaxial layers of graded compositions, where at least the first layer is thicker than the critical thickness and the indium fraction may decrease in sequential layers, are grown on substrate 301. For example, a layer of $In_{0.3}Ga_{0.7}N$ at least 100 nanometers thick, at least 1 micron thick, at least 10 microns thick, or at least 100 microns thick, may be deposited on the GaN substrate, followed by layers of $In_{0.25}Ga_{0.75}N$, and $In_{0.2}Ga_{0.8}N$. The layer thicknesses may be similar to one another, or one or more layers may be substantially thicker than other layers. In a similar embodiment, the series of epitaxial layers of graded compositions may be grown without decreasing indium compositions in sequential layers, but instead sequential layers may have increasing or decreasing indium concentrations. For example, a layer of $In_{0.3}Ga_{0.7}N$ at least 100 nanometers thick, at least 1 micron thick, at least 10 microns thick, or at least 100 microns thick, may be deposited on the GaN substrate, followed by layers of $In_{0.1}Ga_{0.9}N$, and of $In_{0.2}Ga_{0.8}N$. The layer thicknesses may be similar to one another, or one or more layers may be substantially thicker than other layers.

In still another set of embodiments, a graded $Al_xIn_yGa_{(1-x-y)}N$ layer, with at least one stoichiometric coefficient x or y varying continuously as a function of vertical position within the layer, followed by an epitaxial layer of the desired, fixed composition, for example, $In_{0.2}Ga_{0.8}N$. The grading may be linear, nonlinear, quadratic, exponential, or the like. The grading may intentionally overshoot the final composition, followed by reverse grading to the final composition.

Generation of misfit dislocations may be facilitated by roughening the growth surface before deposition, for example, by deposition of nano-dots, islands, ion bombardment, ion implantation, or by light etching. Misfit dislocations may also preferentially be formed by modifying the lattice parameter of the substrate near the epitaxial by a process such as atomic diffusion, atomic doping, ion implantation, and/or mechanically straining the substrate. Generation of misfit dislocations may also be facilitated by deposition of a thin layer of $Al_xGa_{(1-x)}N$, for example, thinner than about 10 to 100 nanometers, followed by annealing to a temperature between about 1000 degrees and about 1400 degrees Celsius in an ammonia-rich atmosphere.

The relaxation and/or growth processes may also generate a significant concentration of threading dislocations. In preferred embodiments, the epitaxial layer is grown thick enough so that a substantial fraction of these dislocations annihilate one another by a similar mechanism as occurs on GaN, as illustrated in FIG. 9. For example, the total thickness of the epitaxial layer may be greater than 100 nanometers, greater than 1 micron, greater than 10 microns, greater than 100 microns, greater than 1 millimeter, or greater than 10 millimeters. The threading dislocation density in the resulting epitaxial layer may be less than $10^9$ cm$^{-2}$, less than $10^8$ cm$^{-2}$, less than $10^7$ cm$^{-2}$, or less than $10^6$ cm$^{-2}$.

In one specific embodiment, the epitaxial layer(s) is deposited by metalorganic chemical vapor deposition (MOCVD). In other embodiments, the epitaxial layer(s) is deposited by molecular beam epitaxy (MBE), by ammonothermal crystal growth, by liquid phase epitaxy (LPE) using a flux, or by a combination of these processes.

In further embodiments, an epitaxial layer is deposited by hydride vapor phase epitaxy or by halide vapor phase epitaxy. For example, a hydrogen halide HX (X=F, Cl, Br, or I) may be passed over one or more crucibles containing at least one of Al, Ga, and/or In, forming a group III metal halide, for example, MX or $MX_3$ plus $H_2$. In some embodiments, halogen $X_2$ (X=F, Cl, Br, or I) is passed over one or more crucibles containing at least one of Al, Ga, and/or In, forming a group III metal halide, for example, MX or $MX_3$. If the halogen is a solid or liquid at room temperature, halogen vapor may be formed by pre-heating, for example, using apparatus similar to that described by Suscavage and co-workers. See M. Suscavage et al., Phys. Stat. Solidi (a) 188, 477 (2001); V. Tassev et al., J. Crystal Growth 235, 140 (2002). The group III metal halide may then be mixed with a nitrogen source, such as ammonia ($NH_3$), hydrazine ($N_2H_4$), or hydrazoic acid ($HN_3$), and brought into contact with a substrate to deposit an $Al_xIn_yGa_{(1-x-y)}N$ epitaxial layer on the substrate. Transport of the group III metal halide and/or the nitrogen source may be facilitated by the use of one or more carrier gases such as nitrogen, hydrogen, and argon, as is known in the art. The thermodynamics of formation of the group III metal bromides and iodides are generally not as favorable as those of the corresponding chlorides or fluorides, but they may decompose more readily on the substrate surface, which may be particularly useful for formation of indium-rich epitaxial layers. An example of a suitable apparatus is described in U.S. Pat. No. 6,955,719, which is hereby incorporated by reference in its entirety. The materials of construction of the apparatus may include silica, quartz, alumina, silicon carbide, boron nitride, pyrolytic boron nitride, or $MC_xN_yO_z$, where $0 \le x, y, z \le 3$ and M represents at least one metal selected from B, Al, Si, Ti, V, Cr, Y, Zr, Nb, Mo, La, Hf, Ta, or W.

In some embodiments, following deposition of an $Al_xIn_yGa_{(1-x-y)}N$ epitaxial layer on one surface of the substrate, the substrate is turned over and a second $Al_xIn_yGa_{(1-x-y)}N$ epitaxial layer is deposited on the back side of the substrate, as described in U.S. Patent Application Ser. Nos. 61/096,304, 61/148,361, 61/181,513 and 61/178,460, each of which is incorporated by reference in its entirety. Following the deposition of the backside $Al_xIn_yGa_{(1-x-y)}N$ epitaxial layer, the substrate may be cut to a desired shape and a protective coating deposited on the edges. The substrate may then be used as a seed crystal for ammonothermal crystal growth of $Al_xIn_yGa_{(1-x-y)}N$ epitaxial layers on both sides of the substrate simultaneously. The ammonothermal growth may be performed using techniques described by U.S. Patent Application Ser. No. 61/181,608 and/or by U.S. Pat. No. 7,642,122, each of which is hereby incorporated by reference in their entirety.

In one embodiment, the InGaN seed layer is grown out to provide a low dislocation density boule of InGaN, which is subsequently cut along predetermined orientations to provide an InGaN substrate of any preferred orientation. For example, InGaN substrates of orientations such as (0001), (1-100), (11-20), (10-11), (20-21), (30-34), (21-31), and other orientations are possible. Using the technique described, InGaN substrates with InN mole fractions from 0.5% to 50% may be provided, for example. These substrates can be used for growth of LED and LD devices at longer emission wavelengths with improved performance compared to devices grown on GaN. For example, high-performance green, yellow, amber, and even red LEDs and LDs can be provided. The amber and red devices based on InGaN can be expected to outperform the incumbent devices based on the cubic (Al,In,Ga)P material system due to the inherent bandstructure limitations of the latter such as low hetero-barrier potentials and presence of indirect bandgap minima close in energy to the direct bandgap, resulting in lower efficiency with increased InAlP mole fraction (for shorter wavelength emission) and poor thermal performance at nearly all emission wavelengths. See J. M. Phillips et al., "Research challenges to ultra-efficient inorganic solid-state lighting," Laser & Photon. Rev. 1, 307-333, 2007. Examples of laser diode structures are described in U.S. Patent Application Ser. No. 61/181,608.

After growth, the $Al_xIn_yGa_{(1-x-y)}N$ epitaxial layer may be removed from the substrate by methods that are known in the art to form a free-standing $Al_xIn_yGa_{(1-x-y)}N$ layer, crystal, wafer, or boule. At least one surface may be lapped, polished, and/or chemical-mechanically polished. The free-standing $Al_xIn_yGa_{(1-x-y)}N$ layer, crystal, wafer, or boule may have a semipolar orientation; a thickness of at least 100 nanometers, a threading dislocation density below about $10^9$ cm$^{-2}$, a stacking fault density less than about $10^3$ cm$^{-1}$, and a strain less than about 0.1%. The thickness may be at least 1 micron, at least 10 microns, at least 100 microns, or at least 1 millimeter. The dislocation density may be less than $10^8$ cm$^{-2}$, less than $10^7$ cm$^{-2}$, or less than $10^6$ cm$^{-2}$. The stacking fault density may be less than about $10^2$ cm$^{-1}$, less than about 10 cm$^{-1}$, or less than about 1 cm$^{-1}$. The strain may be less than about 0.01%, less than $10^{-5}$, or less than about $10^{-6}$.

Active layer(s) may be deposited on the $Al_xIn_yGa_{(1-x-y)}N$ epitaxial layer or on the free-standing $Al_xIn_yGa_{(1-x-y)}N$ layer, crystal, wafer, or boule. The active layer may be incorporated into an optoelectronic or electronic devices such as at least one of a light emitting diode, a laser diode, a photodetector, an avalanche photodiode, a transistor, a rectifier, and a thyristor; one of a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascode switch, an inner sub-band emitter, a quantum well infrared photodetector, a quantum dot infrared photodetector, a solar cell, and a diode for photoelectrochemical water splitting and hydrogen generation.

The InGaN substrates described herein allows the development of a new class of III-nitride visible-spectrum devices that will have superior performance throughout the visible spectrum and allows the realization of maximum efficiencies for systems employing these in applications, such as illumination and displays.

The embodiments described herein are examples of compositions, structures, systems and methods having elements corresponding to the elements of the invention recited in the claims. This written description enables one of ordinary skill in the art to make and use embodiments having alternative elements that likewise correspond to the elements of the invention recited in the claims. The scope thus includes compositions, structures, systems and methods that do not differ from the literal language of the claims, and further includes other compositions, structures, systems and methods with insubstantial differences from the literal language of the claims. While only certain features and embodiments have been illustrated and described herein, many modifications and changes may occur to one of ordinary skill in the relevant art. The appended claims are intended to cover all such modifications and changes.

What is claimed is:

1. A method for forming a biaxially relaxed c-plane epitaxial $Al_xIn_yGa_{(1-x-y)}N$ layer comprising:
    providing a substrate having a surface characterized by an orientation within 5 degrees of a c-plane;
    forming a pattern of channels in the substrate and isolated regions of the substrate defined by the channels, wherein the channels are characterized by a sidewall angle with respect to the surface of the isolated regions between 60 degrees and 90 degrees and a pitch ranging from between 10 nm and 1000 nm; and
    a surface of the isolated regions is characterized by an orientation within 5 degrees of a c-plane;
    growing at least one $Al_xIn_yGa_{(1-x-y)}N$ epitaxial layer on the isolated regions, comprising:
        growing a strained epitaxial $Al_xIn_yGa_{(1-x-y)}N$ region on the isolated regions, wherein at least during initial stages of growth the strained epitaxial $Al_xIn_yGa_{(1-x-y)}N$ region comprises a plurality of misfit dislocations; and
        increasing a thickness of the at least one epitaxial $Al_xIn_yGa_{(1-x-y)}N$ layer to cause the isolated regions to close off by lateral growth and to form a coalesced epitaxial $Al_xIn_yGa_{(1-x-y)}N$ region, wherein the coalesced epitaxial $Al_xIn_yGa_{(1-x-y)}N$ region is substantially free of misfit dislocations; and
    forming at least one biaxially relaxed c-plane epitaxial $Al_xIn_yGa_{(1-x-y)}N$ layer overlying the coalesced epitaxial $Al_xIn_yGa_{(1-x-y)}N$ region, wherein
    a total thickness of the at least one epitaxial $Al_xIn_yGa_{(1-x-y)}N$ layer is at least 100 nm; and
    the biaxially relaxed c-plane epitaxial $Al_xIn_yGa_{(1-x-y)}N$ layer is characterized by a biaxial strain less than 0.1% and a total threading dislocation density less than $10^8$ cm$^{-2}$.

2. The method of claim 1 wherein at least one epitaxial $Al_xIn_yGa_{(1-x-y)}N$ layer comprises at least two epitaxial $Al_xIn_yGa_{(1-x-y)}N$ layers wherein at least one epitaxial $Al_xIn_yGa_{(1-x-y)}N$ layer has a graded composition.

3. The method of claim 1 further comprising subjecting the substrate to a roughening process before formation of the at least one epitaxial $Al_xIn_yGa_{(1-x-y)}N$ epitaxial layer.

4. The method of claim 1 further comprising forming a second epitaxial $Al_xIn_yGa_{(1-x-y)}N$ layer on a back side of the substrate.

5. The method of claim 1 wherein the total thickness of the at least one epitaxial $Al_xIn_yGa_{(1-x-y)}N$ layer is greater than 1 micron.

6. The method of claim 1 wherein the at least one epitaxial $Al_xIn_yGa_{(1-x-y)}N$ layer comprises at least two epitaxial $Al_xIn_yGa_{(1-x-y)}N$ layers characterized by a graded composition.

7. The method of claim 1 wherein increasing the thickness of the at least one epitaxial $Al_xIn_yGa_{(1-x-y)}N$ layer comprises:
    depositing $Al_xGa_{(1-x)}N$ material at a first thickness of less than 100 nanometers;
    annealing the $Al_xGa_{(1-x)}N$ material at a temperature ranging from between about 1000 degrees and 1400 degrees Celsius; and
    depositing $Al_xGa_{(1-x)}N$ material at a second thickness, wherein the a total thickness of the first thickness and the second thickness is greater than 100 nanometers.

8. The method of claim 1 further comprising removing the substrate and the at least one epitaxial $Al_xIn_yGa_{(1-x-y)}N$ layer to form a free-standing biaxially relaxed c-plane epitaxial $Al_xIn_yGa_{(1-x-y)}N$ layer, crystal, wafer, or boule.

9. The method of claim 1 further comprising fabricating a light emitting diode or a laser diode on at least a portion of the at least one epitaxial $Al_xIn_yGa_{(1-x-y)}N$ layer.

10. The method of claim 1, wherein the thickness of the at least one epitaxial $Al_xIn_yGa_{(1-x-y)}N$ layer is greater than 10 microns.

11. The method of claim 1, wherein the substrate comprises bulk gallium nitride.

12. The method of claim 1, wherein the substrate comprises sapphire.

13. The method of claim 1, further comprising depositing an additional epitaxial layer by hydride vapor phase epitaxy overlying the at least one $Al_xIn_yGa_{(1-x-y)}N$ layer.

14. The method of claim 1, wherein,
at least a portion of the at least one epitaxial $Al_xIn_yGa_{(1-x-y)}N$ layer proximate to the substrate is patterned; and
at least a portion of the at least one epitaxial $Al_xIn_yGa_{(1-x-y)}N$ layer distal to the substrate is coalesced or continuous and relaxed, having a strain, relative to fully-relaxed $Al_xIn_yGa_{(1-x-y)}N$, of less than 0.01%.

15. The method of claim 1, wherein the at least one $Al_xIn_yGa_{(1-x-y)}N$ layer comprises more than one epitaxial $Al_xIn_yGa_{(1-x-y)}N$ layer, wherein
at least a portion of a first epitaxial $Al_xIn_yGa_{(1-x-y)}N$ layer overlying the substrate is patterned; and
at least a portion of a second epitaxial $Al_xIn_yGa_{(1-x-y)}N$ layer overlying the first epitaxial $Al_xIn_yGa_{(1-x-y)}N$ layer is coalesced or continuous and relaxed, having a strain, relative to fully-relaxed $Al_xIn_yGa_{(1-x-y)}N$, of less than 0.01%.

16. The method of claim 1, wherein at least one of x and y is between 0.01 and 0.50.

17. A device comprising a biaxially relaxed epitaxial $Al_xIn_yGa_{(1-x-y)}N$ layer formed by the method of claim 1, wherein the epitaxial $Al_xIn_yGa_{1-x-y}N$ layer is characterized by:
0≤x, y, x+y≤1 and y>0.10;
a surface orientation within 5 degrees of a c-plane;
a thickness greater than 100 nanometer;
a concentration of threading dislocations less than $10^8$ $cm^{-2}$; and
a biaxial strain less than 0.1%.

18. A device, comprising at least one layer comprising $Al_xIn_yGa_{1-x-y}N$, wherein the at least one layer is characterized by:
0≤x, y, x+y≤1 and y>0.10;
a surface orientation within 5 degrees of a c-plane;
a thickness greater than 100 nanometer;
a concentration of threading dislocations less than $10^8$ $cm^{-2}$; and
a biaxial strain less than 0.1%.

19. The device of claim 18 wherein the device is selected from among a light emitting diode, a laser diode, a photodetector, an avalanche photodiode, a transistor, a rectifier, and a thyristor; one of a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascode switch, an inner sub-band emitter, a quantum well infrared photodetector, a quantum dot infrared photodetector, a solar cell, and a diode for photoelectrochemical water splitting and hydrogen generation.

* * * * *